US012362333B2

(12) United States Patent
Kim

(10) Patent No.: US 12,362,333 B2
(45) Date of Patent: Jul. 15, 2025

(54) DISPLAY DEVICE

(71) Applicant: Samsung Display Co., Ltd., Yongin-si (KR)

(72) Inventor: Dong Uk Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 132 days.

(21) Appl. No.: 17/077,902

(22) Filed: Oct. 22, 2020

(65) Prior Publication Data

US 2021/0043699 A1 Feb. 11, 2021

Related U.S. Application Data

(63) Continuation of application No. 16/352,706, filed on Mar. 13, 2019, now Pat. No. 10,818,820.

(30) Foreign Application Priority Data

Apr. 13, 2018 (KR) .................... 10-2018-0043383

(51) Int. Cl.
H10H 20/819 (2025.01)
H10H 20/812 (2025.01)
(Continued)

(52) U.S. Cl.
CPC ........ H10H 20/819 (2025.01); H10H 20/812 (2025.01); H10H 20/851 (2025.01);
(Continued)

(58) Field of Classification Search
CPC .. H10K 50/818; H10K 59/124; H10K 59/353; H10K 59/131; H10K 59/38; H10K 59/352
See application file for complete search history.

(56) References Cited

U.S. PATENT DOCUMENTS 8,872,214 B2  10/2014  Negishi et al.
9,229,236 B2   1/2016  Hino et al.
(Continued)

FOREIGN PATENT DOCUMENTS

EP         3 270 424 A1    1/2018
KR    10-2014-0085331 A    7/2014
(Continued)

OTHER PUBLICATIONS

Wang, Lai et al., "Understanding different efficiency droop behaviors in InGaN-based near-UV, blue and green light-emitting diodes through differential carrier lifetime measurements," Tsinghua National Laboratory for Information Science and Technology, Department of Electronic Engineering, Tsinghua University, Beijing, China, 19 pages.
(Continued)

Primary Examiner — Vongsavanh Sengdara
(74) Attorney, Agent, or Firm — Womble Bond Dickinson (US) LLP

(57) ABSTRACT

A display device includes: a substrate including a display region and a non-display region; a plurality of pixels provided in the display region, the plurality of pixels including first to third sub-pixels each having a light emitting region configured to light; a first light emitting element that is provided in each of the first and second sub-pixels and emits first color light, and a second light emitting element that is provided in the third sub-pixel and emits second color light; and a color conversion layer corresponding to each of the first and second sub-pixels, the color conversion layer converting the first color light into light of a set color for each corresponding sub-pixel.

20 Claims, 15 Drawing Sheets

(51) Int. Cl.
*H10H 20/851* (2025.01)
*H10H 20/855* (2025.01)
*H10H 29/14* (2025.01)
*H10K 50/818* (2023.01)
*H10K 59/124* (2023.01)
*H10K 59/131* (2023.01)
*H10K 59/35* (2023.01)
*H10K 59/38* (2023.01)

(52) U.S. Cl.
CPC ........ *H10H 20/855* (2025.01); *H10H 29/142* (2025.01); *H10K 50/818* (2023.02); *H10K 59/124* (2023.02); *H10K 59/131* (2023.02); *H10K 59/352* (2023.02); *H10K 59/353* (2023.02); *H10K 59/38* (2023.02)

(56) References Cited

U.S. PATENT DOCUMENTS

| | | | |
|---|---|---|---|
| 9,773,761 | B2 | 9/2017 | Do |
| 10,211,418 | B2 | 2/2019 | Im et al. |
| 10,268,066 | B2 | 4/2019 | Lee et al. |
| 10,468,394 | B1 | 11/2019 | Xi et al. |
| 10,672,946 | B2 | 6/2020 | Cho et al. |
| 2005/0121683 | A1* | 6/2005 | Nakata ................. H10H 20/819 257/E31.038 |
| 2014/0367633 | A1 | 12/2014 | Bibl et al. |
| 2015/0069362 | A1 | 3/2015 | Ito |
| 2016/0062183 | A1* | 3/2016 | Sung ................. G02F 1/133514 349/71 |
| 2017/0059986 | A1* | 3/2017 | Jun ....................... G03F 7/0047 |
| 2018/0006093 | A1 | 1/2018 | Kim et al. |
| 2018/0006106 | A1* | 1/2018 | Oh ..................... H10K 59/1216 |
| 2018/0011363 | A1 | 1/2018 | Song et al. |
| 2018/0045866 | A1 | 2/2018 | Chae et al. |
| 2018/0047800 | A1* | 2/2018 | Choi ................... H10K 59/8731 |
| 2018/0074372 | A1* | 3/2018 | Takeya .............. G02F 1/133514 |
| 2018/0097152 | A1* | 4/2018 | Akagawa ........... H10H 20/8513 |
| 2018/0206299 | A1 | 7/2018 | Chen |

FOREIGN PATENT DOCUMENTS

| | | |
|---|---|---|
| KR | 10-1490758 B1 | 2/2015 |
| KR | 10-2016-0086739 A | 7/2016 |
| KR | 10-2018-0007376 A | 1/2018 |
| KR | 10-2018-0009015 A | 1/2018 |
| WO | WO 2016/171207 A1 | 10/2016 |
| WO | WO 2017/007770 A2 | 1/2017 |
| WO | WO 2017/219378 A1 | 12/2017 |

OTHER PUBLICATIONS

Extended European Patent Office Search Report for corresponding European Patent Application No. 19169110.4, dated Jul. 24, 2019, 11 pages.

Ling, Han; "Elimination of Interference color in the STN-LCD—White-Mode Display"; vol. 12; No. 3; Optoelectronics Technology; Sep. 30, 1992; pp. 188-197, including Eng. Transl. 20pp.

Yang, Shengyi et al.; "Development and the state of art of plasma display panels"; Journal of Functional Materials; Dec. 30, 2000, pp. 13-15 and 19, including Eng. Transl. 9pp.

* cited by examiner

DISPLAY DEVICE

CROSS-REFERENCE TO RELATED APPLICATIONS

This application is a continuation of U.S. application Ser. No. 16/352,706, filed on Mar. 13, 2019, which claims priority to and the benefit of Korean patent application 10-2018-0043383 filed on Apr. 13, 2018, in the Korean Intellectual Property Office, the entire content of each of which is incorporated herein by reference.

BACKGROUND

1. Field

Embodiments of the present disclosure generally relate to a display device.

2. Related Art

Light emitting diodes (hereinafter, referred to as LEDs) exhibit relatively satisfactory durability even in poor environmental conditions and have excellent performance in terms of lifespan and luminance. Recently, studies for applying such LEDs to various light emitting devices have been actively conducted.

As a part of such studies, there has been a technique for fabricating a micro bar type LED that is small to a degree of micro or nano scale using an inorganic crystal structure, e.g., a structure in which a nitride-based semiconductor is grown. For example, the bar type LED may be fabricated to have a size small enough to constitute a pixel of a self-luminescent display panel, and the like.

SUMMARY

Embodiments of the present disclosure provide a display device including a bar type LED.

According to an aspect of an embodiment of the present disclosure, there is provided a display device including: a substrate including a display region and a non-display region; a plurality of pixels provided in the display region, the plurality of pixels including first to third sub-pixels each having a light emitting region configured to emit light; a first light emitting element that is provided in each of the first and second sub-pixels and configured to emit a first color light, and a second light emitting element that is provided in the third sub-pixel and configured to emit a second color light; and a color conversion layer corresponding to each of the first and second sub-pixels, the color conversion layer being configured to convert the first color light into light of a set (or specific) color for each corresponding sub-pixel.

The first color light and the second color light may include blue-based light, and the first color light may have a wavelength shorter than that of the second color light.

The color conversion layer may include: a first color conversion pattern corresponding to the first sub-pixel, the first color conversion pattern being configured to convert the first color light into red light; a second color conversion pattern corresponding to the second sub-pixel, the second color conversion pattern being configured to convert the first color light into green light; and a light blocking pattern provided between the first color conversion pattern and the second color conversion pattern.

The first color conversion pattern may include a red quantum dot, and the second color conversion pattern may include a green quantum dot.

The color conversion layer may further include a third color conversion pattern that corresponds to the third sub-pixel and is be configured to allow the second color light to be transmitted therethrough. The third color conversion pattern may include any one of a transparent layer and a blue color filter.

The display device may further include an anti-reflection layer provided on the color conversion layer. The anti-reflection layer may include any one of a color filter layer and a polarizing film.

Each of the first light emitting element and the second light emitting element may include: a first conductive semiconductor layer doped with a first conductivity dopant; a second conductive semiconductor layer doped with a second conductivity dopant; and an active layer provided between the first conductive semiconductor layer and the second conductive semiconductor layer.

Each of the first light emitting element and the second light emitting element may include a light emitting diode having a cylindrical column shape or polygonal column shape having a micro or nano scale.

Each of the first light emitting element and the second light emitting element may be disposed on the substrate, and have a first end portion and a second end portion in a length direction.

The display device may further include: a first electrode disposed on the substrate, the first electrode being adjacent to the first end portion of each of the first and second light emitting elements; a second electrode disposed on the same plane as the first electrode, the second electrode being adjacent to the second end portion of each of the first and second light emitting elements; a first contact electrode electrically coupling the first electrode and the first end portion of each of the first and second light emitting elements; and a second contact electrode electrically coupling the second electrode and the second end portion of each of the first and second light emitting elements.

Each of the first to third sub-pixels may include at least one transistor disposed on the substrate to be coupled to a corresponding light emitting element The display device may further include a planarization layer disposed on the color conversion layer to cover the color conversion layer.

According to another aspect of an embodiment of the present disclosure, there is provided a display device including: a substrate including a display region and a non-display region; a plurality of pixels provided in the display region, the plurality of pixels including first to third sub-pixels each having a light emitting region configured to emit light; a light emitting element provided in each of the first to third sub-pixels, the light emitting device (e.g., the light emitting element) being configured to emit light; and a color conversion layer provided in the first to third sub-pixels, the color conversion layer being configured to convert the light into light of a set (or specific) color for each sub-pixel, wherein the light emitting element includes a first light emitting element configured to emit a first color light and a second light emitting element configured to emit a second color light, wherein the first and second light emitting elements are mixed and provided in each of the first to third sub-pixels.

BRIEF DESCRIPTION OF THE DRAWINGS

Example embodiments will now be described in more detail hereinafter with reference to the accompanying drawings; however, the subject matter of the present disclosure may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
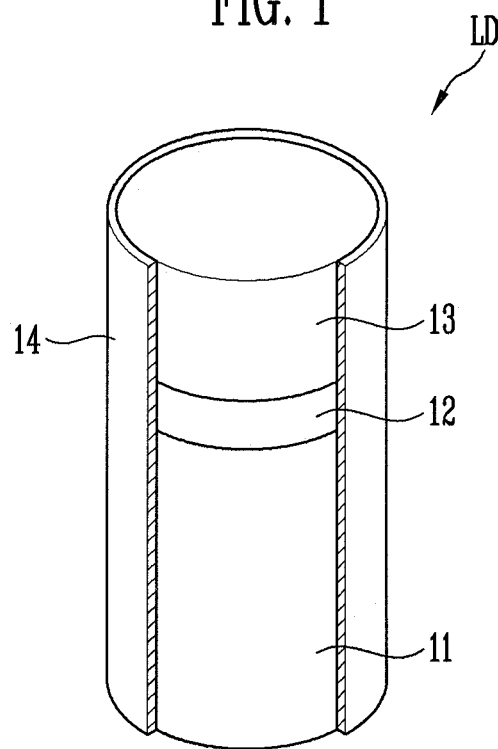
FIG. 1 is a perspective view illustrating a bar type light emitting diode (LED) according to an embodiment of the present disclosure.

The scope of the present disclosure includes various changes and different shapes of the disclosed subject matter, and illustrates embodiments of the present disclosure more detail with particular examples. However, the examples do not limit the present disclosure to certain shapes, but, on the contrary, the present disclosure is intended to cover various modifications and equivalent arrangements, materials, and replacements included within the spirit and scope of the appended claims, and equivalents thereof. The accompanying drawings may be illustrated in a fashion where the figures are expanded for better understanding of the subject matter of the present disclosure.

Like numbers refer to like elements throughout. In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the spirit and scope of the present disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. Additionally, an expression that an element such as a layer, region, substrate or plate is placed "beneath" or "below" another element indicates not only a case where the element is placed "directly beneath" or "just below" the other element but also a case where a further element is interposed between the element and the other element.

Hereinafter, exemplary embodiments of the present disclosure will be described in detail with reference to the accompanying drawings.

FIG. 1 is a perspective view illustrating a bar type light emitting diode according to an embodiment of the present disclosure. Although FIG. 1 illustrates an embodiment of a cylindrical bar type light emitting diode LD, the present disclosure is not limited thereto.

Referring to FIG. 1, the bar type light emitting diode LD according to an embodiment of the present disclosure may include a first conductive semiconductor layer 11, a second conductive semiconductor layer 13, and an active layer 12 interposed between the first and second conductive semiconductor layers 11 and 13.

In an example, the bar type light emitting diode LD may be implemented to have a stack structure in which the first conductive semiconductor layer 11, the active layer 12, and the second conductive semiconductor layer 13 are sequentially stacked. Hereinafter, for convenience of description, the bar type light emitting diode LD is referred to as a "bar type LED LD."

In an embodiment of the present disclosure, the bar type LED LD is provided in a bar shape extending along one direction. When assuming that the extending direction of the bar type LED LD is a length direction, the bar type LED LD may have one end portion and the other end portion along the length direction.

In an embodiment of the present disclosure, one of the first and second conductive semiconductor layers 11 and 13 may be disposed at the one end portion, and the other of the first and second conductive semiconductor layers 11 and 13 may be disposed at the other end portion.

In an embodiment of the present disclosure, the bar type LED LD may be provided in a cylindrical shape. The present disclosure, however, is not limited thereto. For example, the term "bar type" may include a rod-like shape or bar-like shape, which is long in its length direction (i.e., its aspect ratio is greater than 1), such as a cylindrical column or a polygonal column. For example, the length of the bar type LED LD may be larger than the diameter thereof. According to embodiments of the disclosure, "the bar type light emitting diode" may have any suitable elongated shape in which the aspect ratio of the bar type light emitting diode is great than 1.

The bar type LED LD may be fabricated small enough to have a diameter and/or a length, for example, to a degree of micro or nano scale (e.g., the diameter and/or length of the bar type LED LD may be in the range of 1 nanometer to 100 micrometers, such as 1 to 100 nanometers or 1 to 100 micrometers).

However, the size of the bar type LED LD according to the embodiment of the present disclosure is not limited thereto, and may be changed to correspond to desired or required conditions of a display device to which the bar type LED LD is applied.

The first conductive semiconductor layer 11 may include, for example, at least one n-type semiconductor layer. For example, the first conductive semiconductor layer 11 may include at least one semiconductor material among InAlGaN, GaN, AlGaN, InGaN, AlN, and InN, and include a semiconductor layer doped with a first conductive dopant such as Si, Ge or Sn.

The material constituting the first conductive semiconductor layer 11 is not limited thereto, and various suitable materials may be included in the first conductive semiconductor layer 11.

The active layer 12 is formed on the first conductive semiconductor layer 11, and may be formed to have a single or multiple quantum well structure. In an embodiment of the present disclosure, a clad layer doped with a conductive dopant may be formed on the top and/or the bottom of the active layer 12. In an example, the clad layer may be implemented as an AlGaN layer or InAlGaN layer. In addition, it will be apparent that a material such as AlGaN or AlInGaN may also be used for the active layer 12.

When an electric field of a set or predetermined voltage or more is applied to both ends of the bar type LED, electron-hole pairs are combined in the active layer 12, so that the bar type LED emits light (e.g., the bar type LED is configured to emit light).

The second conductive semiconductor layer 13 is formed on the active layer 12, and may include a semiconductor layer having a type (e.g., n-type or p-type) different from that of the first conductive semiconductor layer 11. In an example, the second conductive semiconductor layer 13 may include at least one p-type semiconductor layer. For example, the second conductive semiconductor layer 13 may include at least one semiconductor material among InAlGaN, GaN, AlGaN, InGaN, AlN, and InN, and include a semiconductor layer doped with a second conductive dopant such as Mg.

The material constituting the second conductive semiconductor layer 13 is not limited thereto, and various materials may be included in the second conductive semiconductor layer 13.

In an embodiment of the present disclosure, the bar type LED LD may further include another phosphor layer, another active layer, another semiconductor layer, and/or another electrode layer on the top and/or the bottom of each layer, in addition to the first conductive semiconductor layer 11, the active layer 12, and the second conductive semiconductor layer 13.

Also, the bar type LED LD may further include an insulative film 14. However, in an embodiment of the present disclosure, the insulative film 14 may be omitted, or may be provided to cover only a portion of the first conductive semiconductor layer 11, the active layer 12, and the second conductive semiconductor layer 13.

For example, the insulative film 14 may be provided at a portion of the bar type LED LD other than both ends of the bar type LED LD such that both of the ends of the bar type LED are exposed.

For convenience of description, FIG. 1 illustrates a state in which a portion of the insulative film 14 is removed. However, the side surface of the cylindrical bar type LED LD may be actually surrounded (e.g., completely surrounded) by the insulative film 14.

The insulative film 14 may be provided to surround at least a portion of outer surfaces of the first conductive semiconductor layer 11, the active layer 12, and/or the second conductive semiconductor layer 13. In an example, the insulative film may be provided to surround at least the outer surface of the active layer 12.

In an embodiment of the present disclosure, the insulative film 14 may include a transparent insulating material. For example, the insulative film 14 may include at least one insulating material selected from the group consisting of $SiO_2$, $Si_3N_4$, $Al_2O_3$, and $TiO_2$. However, the present disclosure is not limited thereto, and various suitable materials having insulating properties (e.g., electrically insulating properties) may be used.

When the insulative film 14 is provided to the bar type LED LD, the active layer 12 can be prevented from being short-circuited with a first electrode and/or a second electrode (or a likelihood of such a short-circuit can be reduced).

In addition, as the insulative film 14 is formed, a surface defect of the bar type LED LD is minimized or reduced, so that the lifespan and efficiency of the bar type LED LD can be improved. In addition, when a plurality of bar type LEDs LD are densely arranged, the insulative film 14 can prevent (or reduce a likelihood of) an unwanted short circuit that may occur between the bar type LEDs LD.

The above-described bar type LED LD may be used as a light emitting source for various suitable display devices. In an example, the bar type LED LD may be used as a light emitting source for lighting devices or self-luminescent display devices.

Figure 2A:
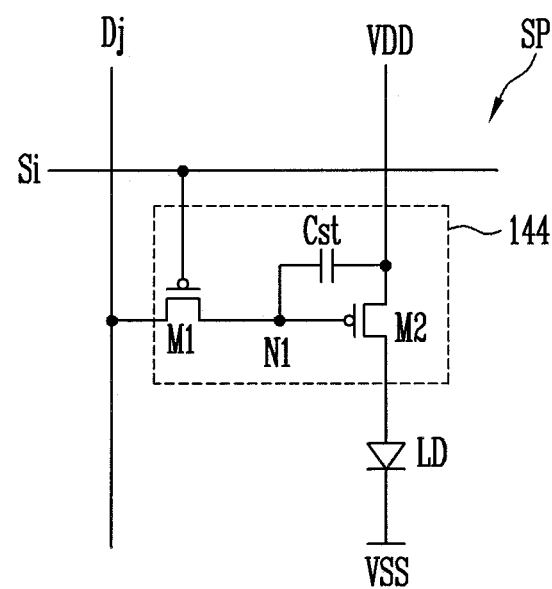
FIGS. 2A-2B are circuit diagrams illustrating a unit light emitting region of a light emitting device according to an embodiment of the present disclosure.
Figure 2B:
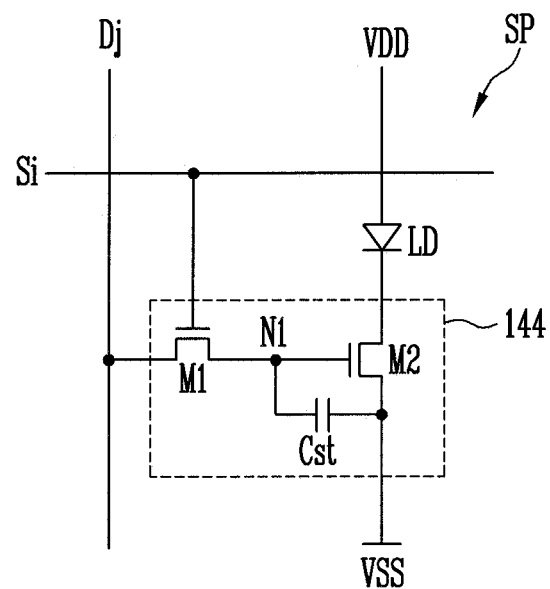

FIGS. 2A-2B are circuit diagrams illustrating a unit light emitting region of a light emitting device according to an embodiment of the present disclosure.

For example, FIGS. 2A-2B illustrate examples of a subpixel constituting an active light emitting display panel. In an embodiment of the present disclosure, the unit light emitting region may include one sub-pixel.

Referring to FIG. 2A, the sub-pixel SP may include at least one bar type LED LD and a driving circuit 144 coupled to (e.g., connected to) the bar type LED LD to drive the bar type LED LD.

A first electrode (e.g., an anode electrode) of the bar type LED LD is coupled to a first power source VDD via the driving circuit 144, and a second electrode (e.g., a cathode electrode) of the bar type LED LD is coupled to a second power source VSS.

The first power source VDD and the second power source VSS may have different potentials. In an example, the second power source VSS may have a potential lower by a threshold voltage of the bar type LED LD or more than that of the first power source VDD.

The bar type LED LD may be configured to emit light having a luminance corresponding to a driving current controlled by the driving circuit 144.

Meanwhile, although FIG. 2A discloses an embodiment in which only one bar type LED LD is included in the sub-pixel SP, the present disclosure is not limited thereto. For example, the sub-pixel SP may include a plurality of bar type LEDs LD coupled in (e.g., connected in) parallel to each other.

In an embodiment of the present disclosure, the driving circuit 144 may include first and second transistors M1 and M2 and a storage capacitor Cst. However, the structure of the driving circuit 144 is not limited to the embodiment shown in FIG. 2A.

A first electrode of the first transistor (switching transistor) M1 is coupled to a data line Dj, and a second electrode of the first transistor M1 is coupled to a first node N1. The first and second electrodes of the first transistor M1 are electrodes different from each other. For example, when the first electrode is a source electrode, the second electrode may be a drain electrode. In addition, a gate electrode of the first transistor M1 is coupled to a scan line Si.

The first transistor M1 is turned on when a scan signal having a voltage (e.g., a low voltage) at which the first transistor M1 can be turned on is supplied from the scan line Si, to allow the data line Dj and the first node N1 to be electrically coupled to each other. A data signal of a corresponding frame is supplied to the data line Dj. Accordingly, the data signal is transferred to the first node N1. The data signal transferred to the first node N1 is charged in the storage capacitor Cst.

A first electrode of the second transistor (driving transistor) M2 is coupled to the first power source VDD, and a second electrode of the second transistor M2 is coupled to the first electrode of the bar type LED LD. In addition, a gate electrode of the second transistor M2 is coupled to the first node N1. The second transistor M2 controls the amount of driving current supplied to the bar type LED LD, corresponding to a voltage of the first node N1.

One electrode of the storage capacitor Cst is coupled to the first power source VDD, and the other electrode of the storage capacitor Cst is coupled to the first node N1. The storage capacitor Cst charges a voltage corresponding to the data signal supplied to the first node N1, and maintains the charged voltage until a data signal of a next frame is supplied.

For convenience, FIG. 2A illustrates the driving circuit 144 having a relatively simple structure, which includes the first transistor M1 for transferring the data signal to the sub-pixel SP, the storage capacitor Cst for storing the data signal, and the second transistor M2 for supplying a driving current corresponding to the data signal to the bar type LED LD.

However, the present disclosure is not limited thereto, and the structure of the driving circuit 144 may be variously modified and implemented. In an example, it will be apparent that the driving circuit 144 may further include at least one transistor device such as a transistor device for compensating for a threshold voltage of the second transistor M2, a transistor device for initializing the first node N1, and/or a transistor device for controlling a light emission time of the bar type LED LD, or another circuit device such as a boosting capacitor for boosting the voltage of the first node N1.

In addition, although FIG. 2A illustrates that all of the transistors, e.g., the first and second transistors M1 and M2 included in the driving circuit 144 are P-type transistors, the present disclosure is not limited thereto. That is, at least one of the first and second transistors M1 and M2 included in the driving circuit 144 may be changed to an N-type transistor.

Referring to FIG. 2B, in an embodiment of the present disclosure, the first and second transistors M1 and M2 may be implemented as N-type transistors. The configuration and operation of the driving circuit 144 shown in FIG. 2B are similar to those of the driving circuit 144 of FIG. 2A, except that the connection positions of some components are changed due to the change in transistor type. Therefore, a redundant description of the driving circuit 144 shown in FIG. 2B will not be repeated here.

Figure 3:
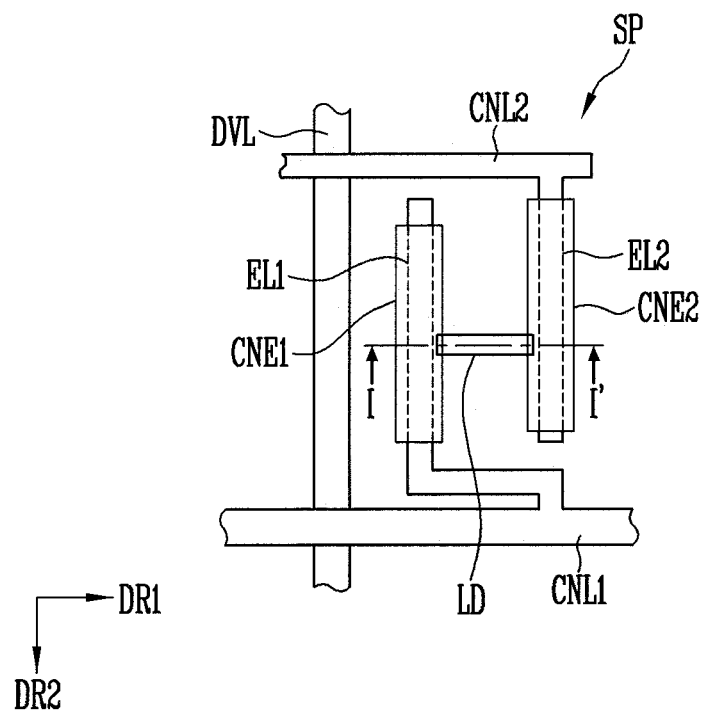
FIG. 3 is a plan view illustrating a unit light emitting region of a light emitting device including the bar type LED of FIG. 1.
Figure 4A:
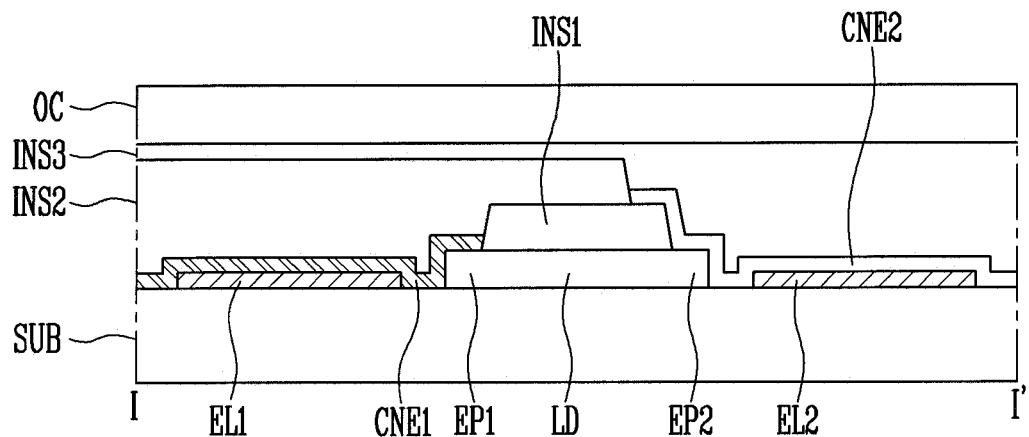
FIG. 4A is a cross-sectional view taken along line I-I' of FIG. 3.

FIG. 3 is a plan view illustrating a unit light emitting region of a light emitting device including the bar type LED of FIG. 1. FIG. 4A is a cross-sectional view taken along line I-I' of FIG. 3.

Although FIG. 3 illustrates that the bar type LED is aligned in a horizontal direction for convenience of description, the alignment of the bar type LED LD is not limited thereto. For example, the bar type LED may be aligned in a diagonal direction between the first and second electrodes.

Also, in FIG. 3, the unit light emitting region may be a pixel region including one sub-pixel of a light emitting display panel. In addition, although FIG. 3 illustrates an embodiment in which one bar type LED is provided in the unit light emitting region, the present disclosure is not limited thereto. For example, a plurality of bar type LEDs may be provided in the unit light emitting region.

Referring to FIGS. 1-4A, the light emitting device according to the embodiment of the present disclosure may include a substrate SUB, first and second electrodes EL1 and EL2, a bar type LED LD, and first and second contact electrodes CNE1 and CNE2.

The substrate SUB may include an insulative material such as glass, organic polymer, or quartz. The substrate SUB may be made of a material having flexibility to be bendable or foldable. The substrate SUB may have a single-layer or multi-layered structure.

For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the substrate SUB may be variously changed.

The first electrode EL1 and the second electrode EL2 may be provided on the substrate SUB. When viewed on a plane, the first electrode EL1 and the second electrode EL2 may be provided on the substrate SUB to be spaced apart from each other with the bar type LED LD interposed therebetween.

The first electrode EL1 and the second electrode EL2 may be disposed on the same plane, and have the same height. When the first electrode EL1 and the second electrode EL2 have the same height, the bar type LED LD can be more stably coupled to the first and second electrodes EL1 and EL2.

The first and second electrodes EL1 and EL2 may be made of a conductive material. The conductive material may include a metal such as Ag, Mg, Al, Pt, Pd, Au, Ni, Nd, Ir, Cr, or any alloy thereof, a conductive oxide such as indium tin oxide (ITO), indium zinc oxide (IZO), zinc oxide (ZnO), or indium tin zinc oxide (ITZO), a conductive polymer such as PEDOT, and the like.

Also, the first and second electrodes EL1 and EL2 may be formed in a single layer. However, the present disclosure is not limited thereto, and the first and second electrodes EL1 and EL2 may be formed in a multi-layer in which two or more materials among metals, alloys, conductive oxides, and conductive polymers are stacked.

The material of the first and second electrodes EL1 and EL2 is not limited to the above-described materials. For example, the first and second electrodes EL1 and EL2 may be made of a conductive material having a constant reflexibility such that light emitted from both end portions of the bar type LED LD advance in a direction (e.g., a front direction) in which an image is displayed.

For convenience of description, it is illustrated that the first and second electrodes EL1 and EL2 are provided directly on the substrate SUB, but the present disclosure is not limited. For example, a component for driving the light emitting device in a passive matrix manner or active matrix manner may further provided between the first and second electrodes EL1 and EL2 and the substrate SUB.

When the light emitting device is driven in the active matrix manner, signal lines, an insulating layer, and/or a transistor may be provided between the first and second electrodes EL1 and EL2 and the substrate SUB.

The signal lines may include a scan line, a data line, a power line, and the like. The transistor is coupled to the signal lines, and may include a gate electrode, a semiconductor layer, a source electrode, and a drain electrode.

One of the source and drain electrodes of the transistor may be coupled to any one of the first and second electrodes EL1 and EL2, and a data signal of the data line may be applied to the one of the first and second electrodes EL1 and EL2 through the transistor. It will be apparent that the signal lines, the insulating layer, and/or the transistor may be provided in various numbers and configurations.

In an embodiment of the present disclosure, the first electrode EL1 may be coupled to a first connecting line CNL1. The first connecting line CNL1 may be integrally provided together with the first electrode EL1, and extend along a first direction DR1 when viewed on a plane.

In some embodiments, the first connecting line CNL1 may be electrically coupled to a driving voltage line DVL through a contact hole when the light emitting device is driven in the active matrix manner. Therefore, a signal of the driving voltage line DVL may be applied to the first electrode EL1 through the first connecting line CNL1.

The second electrode EL2 may be coupled to a second connecting line CNL2. The second connecting line CNL2 may be integrally provided together with the second electrode EL2, and extend along the first direction DR1.

The second connecting line CNL2 may be electrically coupled to the transistor through a contact hole. Therefore, a signal provided to the transistor may be applied to the second electrode EL2 through the second connecting line CNL2.

The bar type LED LD may be provided between the first and second electrodes EL1 and EL2 on the substrate SUB. The bar type LED LD may be self-aligned by an electric field formed between the first and second electrodes EL1 and EL2. The bar type LED LD may be provided in a bar shape extending in the first direction DR1.

The bar type LED LD may include a first conductive semiconductor layer 11, an active layer 12, and a second conductive semiconductor layer 13. In some embodiments, the bar type LED LD may further include an electrode layer provided on the top of the second conductive semiconductor layer 13.

The electrode layer may include a metal or a metal oxide. For example, the electrode layer may be formed of one of or a mixture of chromium (Cr), titanium (Ti), aluminum (Al), gold (Au), nickel (Ni), ITO, and an oxide or an alloy thereof, but the present disclosure is not limited thereto.

When the electrode layer is included, the bar type LED LD has a feature in that the second conductive semiconductor layer 130 and the second electrode EL2 can be joined at a temperature lower than that required in a process of forming the second contact electrode CNE2 at a joint of the second conductive semiconductor layer 130 and the second electrode EL2.

The bar type LED LD may include a first end portion EP1 and a second end portion EP2 along the first direction DR1. One of the first and second conductive semiconductor layers 11 and 13 may be disposed at the first end portion EP1, and the other of the first and second conductive semiconductor layers 11 and 13 may be disposed at the second end portion EP2.

A first insulating layer INS1 covering a portion of an upper surface of the bar type LED LD may be provided on the bar type LED LD. Therefore, the first and second end portions EP1 and EP2 of the bar type LED LD may be exposed to the outside.

The contact electrode CNE1 for electrically and/or physically stably coupling the first electrode EL1 and the first end portion EP1 of the bar type LED LD may be provided on the first electrode EL1.

The first contact electrode CNE1 may be made of a transparent conductive material such as, for example, ITO, IZO or ITZO such that light emitted from the bar type LED LD can be transmitted therethrough, but the present disclosure is not limited thereto.

The first contact electrode CNE1 covers the first electrode EL1 when viewed on a plane, and may overlap with the first electrode EL1. Also, the first contact electrode CNE1 may partially overlap with the first end portion EP1 of the bar type LED LD.

A second insulating layer INS2 covering the first contact electrode CNE1 may be provided over the first contact electrode CNE1. The second insulating layer INS2 allows the first contact electrode CNE1 not to be exposed to the outside, so that corrosion of the first contact electrode CNE1 can be prevented (or reduced). The second insulating layer INS2 may include any one of an inorganic insulating material and an organic insulating material.

The second contact electrode CNE2 for electrically and/or physically stably coupling the second electrode EL2 and the second end portion EP2 of the bar type LED LD may be provided on the second electrode EL2.

The second contact electrode CNE2 may be made of the same (e.g., substantially the same) material as the first contact electrode CNE1, but the present disclosure is not limited thereto.

The second contact electrode CNE2 covers the second electrode EL2 when viewed on a plane, and may overlap with the second electrode EL2. Also, the second contact electrode CNE2 may partially overlap with the second end portion EP2 of the bar type LED LD.

A third insulating layer INS3 covering the second contact electrode CNE2 may be provided over the second contact electrode CNE2.

The third insulating layer INS3 allows the second contact electrode CNE2 not to be exposed to the outside, so that corrosion of the second contact electrode CNE2 can be prevented (or reduced). The third insulating layer INS3 may include any one of an inorganic insulating material and an organic insulating material.

An overcoat layer OC may be provided on the third insulating layer INS3.

The overcoat layer OC may be a planarization layer for reducing a step difference generated by components disposed on the bottom thereof. Also, the overcoat layer OC may be an encapsulation layer for preventing oxygen and moisture from penetrating into the bar type LED LD (or for reducing a likelihood or amount of oxygen and moisture penetrating into the bar type LED LD).

As described above, the first end portion EP1 of the bar type LED LD may be in contact with the first electrode EL1, and the second end portion EP2 of the bar type LED LD may be in contact with the second electrode EL2. For example, the first conductive semiconductor layer 11 of the bar type LED LD may be in contact with the first electrode EL1, and the second conductive semiconductor layer 13 of the bar type LED LD may be in contact with the second electrode EL2.

Accordingly, the first and second conductive semiconductor layers 11 and 13 of the bar type LED LD can be applied with (or supplied with) a set (e.g., predetermined) voltage through the first electrode EL1 and the second electrode EL2.

When an electric field of a set or predetermined voltage or more is applied to both the end portions EP1 and EP2 of the bar type LED LD, electron-hole pairs are combined in the active layer 12, so that each bar type LED emits light (e.g., each bar type LED is configured to emit light).

Figure 4B:
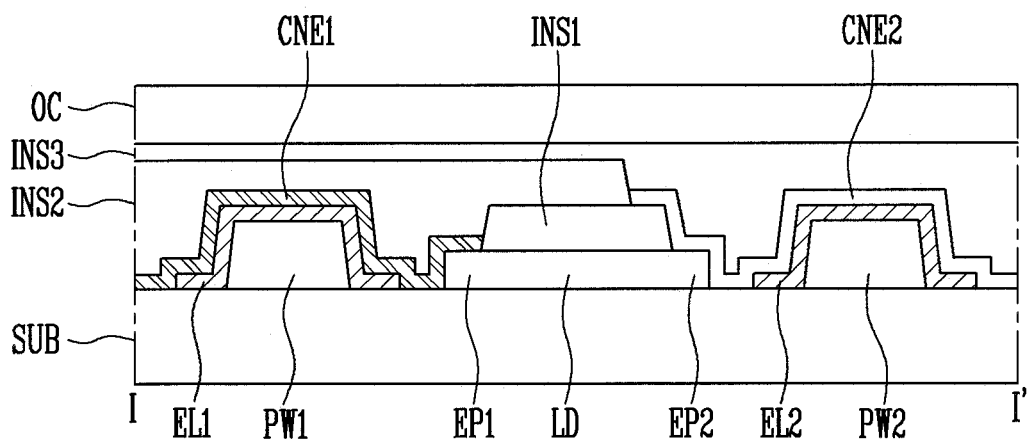
FIG. 4B is a cross-sectional view corresponding to the line I-I' of FIG. 3 illustrating another embodiment of the unit light emitting region of the light emitting device of FIG. 3.

FIG. 4B illustrates another embodiment of the unit light emitting region of the light emitting device of FIG. 3, which is a cross-sectional view corresponding to the line I-I' of FIG. 3. In FIG. 4B, portions different from those of the above-described embodiment will be mainly described to avoid redundancy (e.g., redundant descriptions of the same features will not be repeated). Portions of the device not particularly described in this embodiment follow those of the above-described embodiment. In addition, identical reference numerals refer to identical components, and similar reference numerals refer to similar components.

The light emitting device shown in FIG. 4B may have a configuration identical or similar to that of the light emitting device shown in FIG. 4A, except that a first partition wall PW1 is disposed between a substrate SUB and a first electrode EL1 and a second partition wall PW2 is disposed between a substrate SUB and a second electrode EL2.

Referring to FIGS. 3 and 4B, the light emitting device according to the embodiment of the present disclosure may include the substrate SUB, the first and second partition walls PW1 and PW2, the first and second electrodes EL1 and EL2, a bar type LED LD, and first and second contact electrodes CNE1 and CNE2.

The first and second partition walls PW1 and PW2 may be disposed on the substrate SUB to be spaced apart from each other. In an embodiment of the present disclosure, the first and second partition walls PW1 and PW2 may be disposed on the substrate SUB to be spaced apart from each other with a length longer than that of the bar type LED LD.

The first and second partition walls PW1 and PW2 may be made of an insulating material including an inorganic material or an organic material, but the present disclosure is not limited thereto. The first and second partition walls PW1 and PW2 may have a trapezoidal shape of which side surfaces have a slope of a set or predetermined angle, but the present disclosure is not limited thereto.

The first electrode EL1 may be provided on the first partition wall PW1, and the second electrode EL2 may be provided on the second partition wall PW2.

The first and second electrodes EL1 and EL2 may be provided to correspond to the shapes of the first and second partition walls PW1 and PW2, respectively. Therefore, the first electrode EL1 may have a slope corresponding to the gradient of the first partition wall PW1, and the second electrode EL2 may have a slope corresponding to the gradient of the second partition wall PW2.

In an embodiment of the present disclosure, the first and second electrodes EL1 and EL2 may be made of a conductive material having a constant (e.g., substantially constant) reflexibility. The first and second electrodes EL1 and EL2 may be configured to allow light emitted from both end portions EP1 and EP2 of the bar type LED LD to advance in a direction (e.g., a front direction) in which an image is displayed.

For example, since the first and second electrodes EL1 and EL2 have shapes respectively corresponding to those of the first and second partition walls PW1 and PW2, light emitted from both the end portions EP1 and EP2 of the bar type LED LD are reflected by the first and second electrodes EL1 and EL2, to further advance in the front direction. Thus, the efficiency of light emitted from the bar type LED LD can be improved.

In an embodiment of the present disclosure, the first and second partition walls PW1 and PW2 may serve together with the first and second electrodes EL1 and EL2 as reflecting members for improving the efficiency of light emitted from the bar type LED LD.

Figure 5:
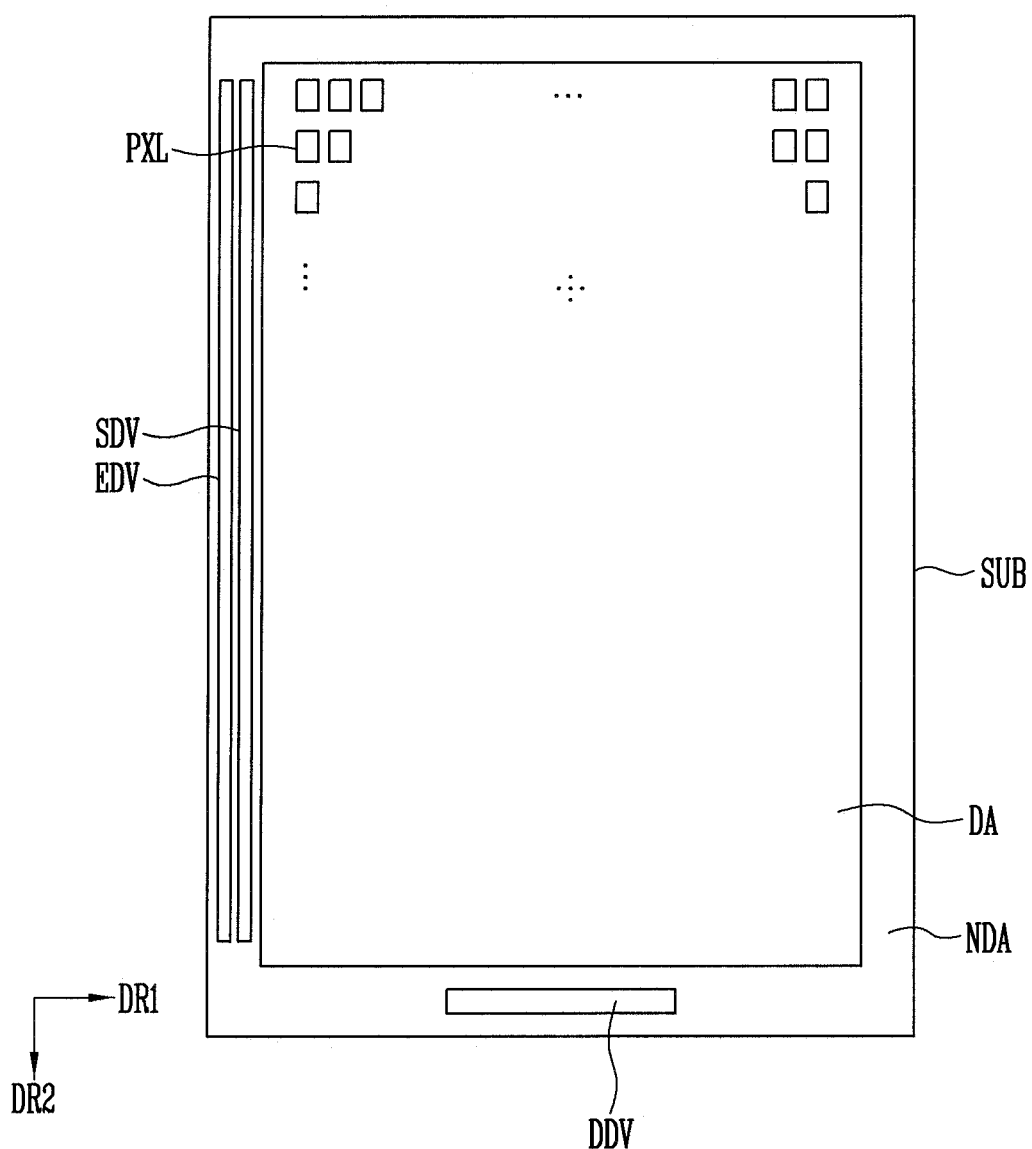
FIG. 5 is a schematic plan view illustrating a display device according to an embodiment of the present disclosure using the bar type LED shown in FIG. 1 as a light emitting source.

FIG. 5 illustrates a display device according to an embodiment of the present disclosure, which is a schematic plan view of the display device using the bar type LED shown in FIG. 1 as a light emitting source.

Referring to FIGS. 1 and 5, the display device according to the present disclosure may include a substrate SUB, pixels PXL provided on the substrate SUB, a driving unit that is provided on the substrate SUB and drives the pixels PXL, and a line unit that couples the pixels PXL and the driving unit.

The substrate SUB may include a display region DA and a non-display region NDA.

The display region DA may be a region in which the pixels PXL for displaying an image are provided. The non-display region NDA may be a region in which the driving unit for driving the pixels PXL and a portion of the line unit that couples the pixels PXL and the driving unit are provided.

The display region DA may have various suitable shapes. For example, the display region DA may be provided in various suitable shapes such as a closed polygon including linear sides, a circle, an ellipse, etc., including curved sides, and a semicircle, a semi-ellipse, etc., including linear and curved sides.

When the display region DA includes a plurality of regions, each region may also be provided in various shapes such as a closed polygon including linear sides, a circle, an ellipse, etc., including curved sides, and a semicircle, a semi-ellipse, etc., including linear and curved sides. In addition, the areas of the plurality of regions may be the same or different from one another.

In an embodiment of the present disclosure, a case where the display region DA is provided as one region having a quadrangular shape including linear sides is described as an example.

The non-display area NDA may be provided at at least one side of the display area DA. In an embodiment of the present disclosure, the non-display area NDA may surround the circumference of the display region DA.

The pixels PXL may be provided in the display region DA on the substrate SUB. Each of the pixels PXL is a minimum unit for displaying an image, and may be provided as a plurality.

Each pixel PXL may be configured to emit light of any one color among red, green, and blue, but the present disclosure is not limited thereto. For example, the pixel PXL may be configured to emit light of any one color among cyan, magenta, yellow, and white.

The pixel PXL may be provided as a plurality to be arranged in a matrix form along rows extending in a first direction DR1 and columns extending in a second direction DR2 intersecting the first direction DR1. However, the arrangement form of the pixels PXL is not particularly limited, and the pixels PXL may be arranged in various suitable forms.

The driving unit provides a signal to each pixel PXL through the line unit, and accordingly, the driving of the pixel PXL can be controlled. In FIG. 5, the line unit is omitted for convenience of description.

The drive unit may include a scan driver SDV for providing a scan signal to the pixels PXL through scan lines, an emission driver EDV for providing an emission control signal to the pixels PXL through emission control lines, a data driver DDV for providing a data signal to the pixels PXL through data lines, and a timing controller. The timing controller may control the scan driver SDV, the emission driver EDV, and the data driver DDV.

Figure 6:
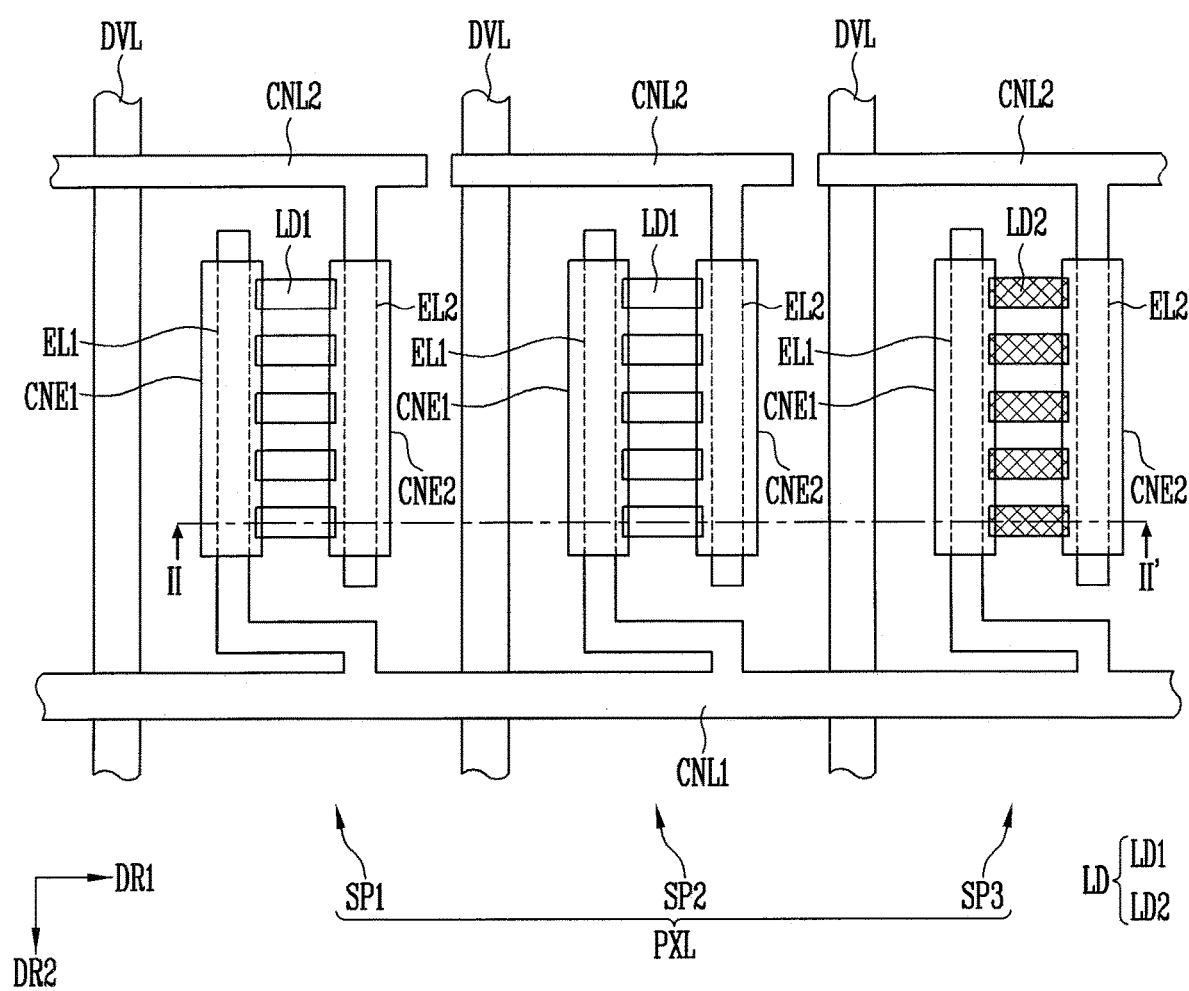
FIG. 6 is a plan view schematically illustrating first to third sub-pixels included in one pixel among pixels shown in FIG. 5.
Figure 7:
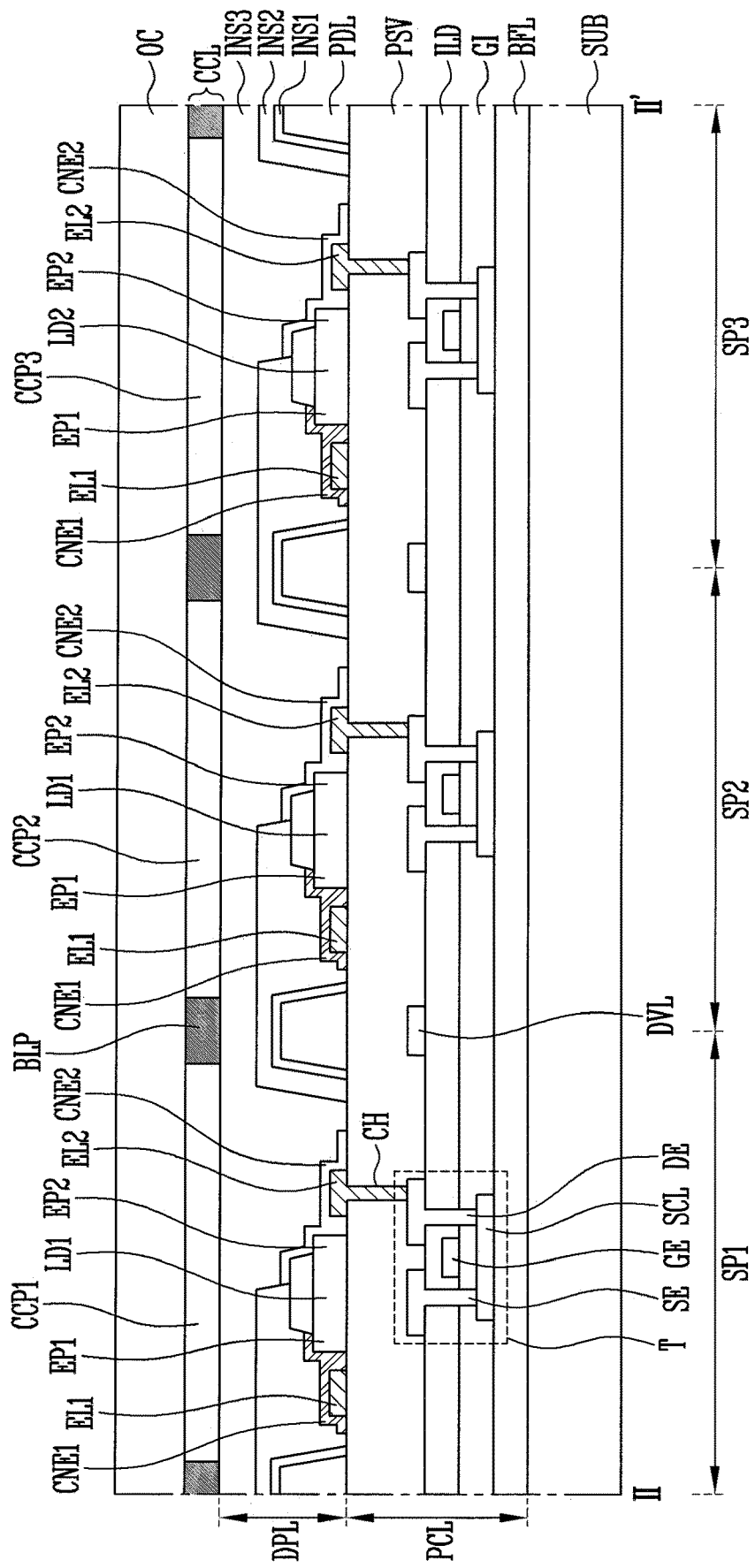
FIG. 7 is a cross-sectional view taken along line II-II' of FIG. 6.
Figure 8A:
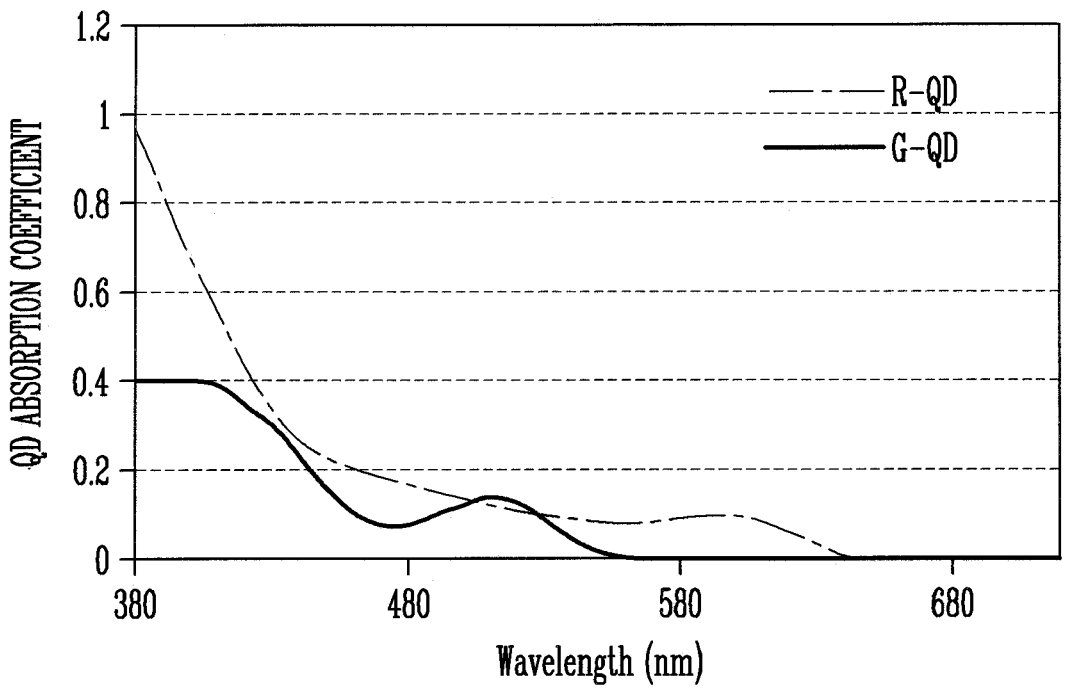
FIG. 8A is a graph illustrating absorption coefficients of red and green quantum dots with respect to changes in wavelength of incident light.
Figure 8B:
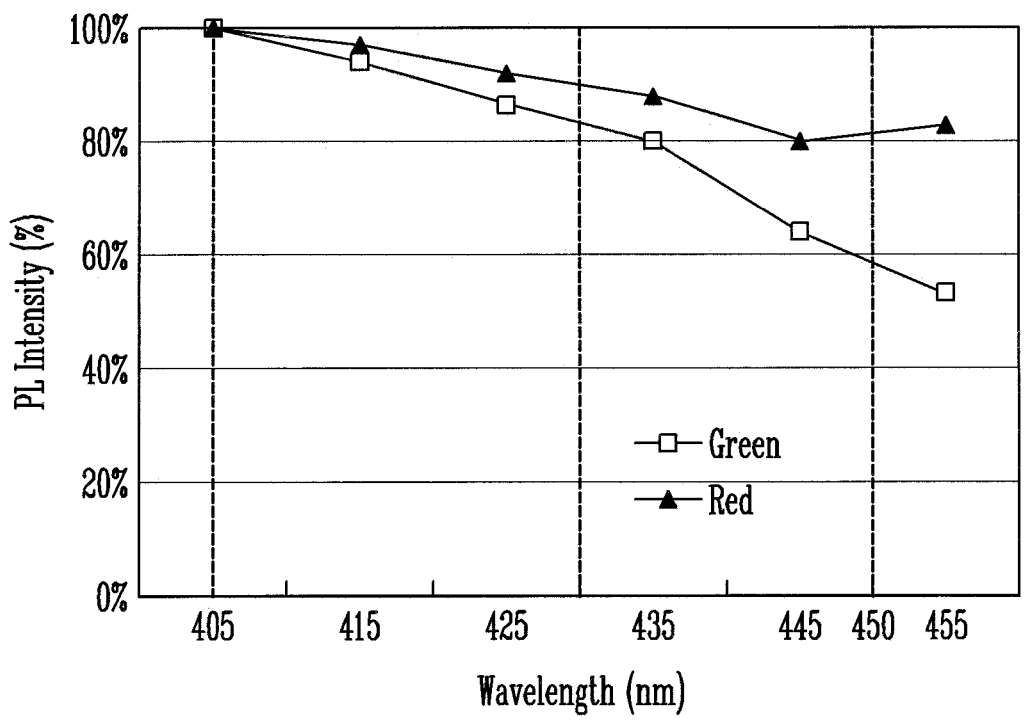
FIG. 8B is a graph illustrating changes in light emission efficiency of the red and green quantum dots with respect to changes in wavelength of incident light.

FIG. 6 is a plan view schematically illustrating first to third sub-pixels included in one pixel among the pixels shown in FIG. 5. FIG. 7 is a cross-sectional view taken along line II-II' of FIG. 6. FIG. 8A is a graph illustrating absorption coefficients of red and green quantum dots with respect to changes in wavelength of incident light, and FIG. 8B is a graph illustrating changes in light emission efficiency of the red and green quantum dots with respect to changes in wavelength of incident light.

For convenience of description, FIG. 6 illustrates that a plurality of bar type LEDs are arranged in a horizontal direction, but the arrangement of the bar type LEDs is not limited thereto.

Also, in FIG. 6, illustration of a transistor coupled to the bar type LEDs and signal lines coupled to the transistor is omitted for convenience of description.

In an embodiment of the present disclosure, portions different from those of the above-described embodiment will be mainly described to avoid redundancy (e.g., redundant descriptions of features will not be repeated here). Portions of the device not particularly described in this embodiment follow those of the above-described embodiment. In addition, identical reference numerals refer to identical components, and similar reference numerals refer to similar components. In FIG. 6, a unit light emitting region may be a pixel region including one pixel including the first to third sub-pixels.

Referring to FIGS. 1-7 and 8A-8B, the display device according to the embodiment of the present disclosure may include a substrate SUB on which a plurality of pixels PXL are provided. One pixel PXL may include a first sub-pixel SP1, a second sub-pixel SP2, and a third sub-pixel SP3, which are provided on the substrate SUB.

The first to third sub-pixels SP1, SP2, and SP3 may be pixel regions for displaying an image in the one pixel PXL, and may be light emitting regions that are configured to emit light.

Each of the first to third sub-pixels SP1, SP2, and SP3 may include the substrate SUB, a pixel circuit unit PCL, and a display element layer DPL.

The substrate SUB may include an insulative material such as glass, organic polymer, or quartz. The substrate SUB may be made of a material having flexibility to be bendable or foldable. The substrate SUB may have a single-layer or multi-layered structure.

The pixel circuit unit PCL may include a buffer layer BFL disposed on the substrate SUB, a transistor T disposed on the buffer layer BFL, and a driving voltage line DVL.

The buffer layer BFL may prevent an impurity from being diffused into the transistor T (or may reduce a likelihood or amount of such diffusion). The buffer layer BFL may be provided in a single layer, or may be provided in a multi-layer including at least two layers.

When the buffer layer BFL is provided in the multi-layer form, the layers may be formed of the same material or be formed of different materials. The buffer layer BFL may be omitted according to the material and process conditions of the substrate SUB.

The transistor T may be electrically coupled to some of a plurality of bar type LEDs LD included in the display element layer DPL to drive the bar type LED LD. The transistor T may include a semiconductor layer SCL, a gate electrode GE, a source electrode SE, and a drain electrode DE.

The semiconductor layer SCL may be disposed on the buffer layer BFL. The semiconductor layer SCL may include a source region in contact with the source electrode SE and a drain region in contact with the drain electrode DE. A region between the source region and the drain region may be a channel region.

The semiconductor layer SCL may be a semiconductor pattern made of poly-silicon, amorphous silicon, oxide semiconductor, etc. The channel region is a semiconductor pattern undoped with an impurity, and may be an intrinsic semiconductor. The source region and the drain region are semiconductor patterns dope with the impurity.

The gate electrode GE may be provided on the semiconductor layer SCL with a gate insulating layer GI interposed therebetween.

The source electrode SE and the drain electrode DE may be in contact with the source region and the drain region of the semiconductor layer SCL through contact holes penetrating an interlayer insulating layer ILD and the gate insulating layer GI, respectively.

A protective layer PSV may be provided over the transistor T.

In some embodiments, the driving voltage line DVL is provided on the interlayer insulating layer ILD, and may extend along a second direction DR2 when viewed on a plane. The driving voltage line DVL may be electrically coupled to the display element layer DPL through a contact hole penetrating the protective layer PSV.

The display element layer DPL may include the bar type LEDs LD provided on the protective layer PSV.

In an embodiment of the present disclosure, the bar type LEDs LD may include a first bar type LED LD1 and a second bar type LED LD2. The first bar type LED LD1 may be provided in the first and second sub-pixels SP1 and SP2, and the second bar type LED LD2 may be provided in the third sub-pixel SP3.

Each of the first and second bar type LEDs LD1 and LD2 may include a first conductive semiconductor layer 11, a second conductive semiconductor layer 13, and an active layer 12 interposed between the first and second conductive semiconductor layers 11 and 13.

Also, each of the first and second bar type LEDs LD1 and LD2 may include a first end portion EP1 and a second end portion EP2 along a first direction DR1. One of the first and second conductive semiconductor layers 11 and 13 may be disposed at the first end portion EP1, and the other of the first and second conductive semiconductor layers 11 and 13 may be disposed at the second end portion EP2.

In an embodiment of the present disclosure, the first bar type LED LD1 may be configured to emit a first color light, and the second bar type LED LD2 may be configured to emit a second color light.

The first color light and the second color light may include blue-based light having different wavelength bands. For example, the first color light may be blue light having a wavelength band shorter than that of the second color light. In an embodiment of the present disclosure, the first color light may be blue-based light having a wavelength of about 405 nm, and the second color light may be blue-based light having a wavelength of about 450 nm.

Hereinafter, for convenience of description, the first color light is referred to as a first blue light, and the second color light is referred to as a second blue light.

The first bar type LED LD1 be configured to emit the first blue light having a wavelength shorter than that of the second blue light may be formed by adjusting the content (e.g., amount) of In a semiconductor material constituting the active layer 12 of the second bar type LED LD2 in a process of fabricating the second bar type LED LD2.

In some embodiments, the second bar type LED LD2 be configured to emit the second blue light having a wavelength longer than that of the first blue light may be formed by adjusting the content (e.g., amount) of In a semiconductor material constituting the active layer 12 of the first bar type LED LD1 in a process of fabricating the first bar type LED LD1.

The display element layer DPL may further include a pixel defining layer DPL, first and second electrodes EL1 and EL2, first and second contact electrodes CNE1 and CNE2, and first and second connecting lines CNL1 and CNL2.

The pixel defining layer PDL is provided on the protective layer PSV, and may define a light emitting region in each of the first to third sub-pixels SP1, SP2, and SP3. The pixel defining layer PDL may include an opening that exposes bar type LEDs LD included in each of the first to third sub-pixels SP1, SP2, and SP3.

Two pixel defining layers PDL adjacent to each other on the substrate SUB may be spaced apart from each other at a set or certain distance. For example, two pixel defining layers PDL adjacent to each other may be spaced apart from each other with a length longer than the of the bar type LED LD on the substrate SUB. The pixel defining layer PDL may be made of an insulating material including an inorganic material or an organic material, but the present disclosure is not limited thereto.

In an embodiment of the present disclosure, the pixel defining layer PDL may be made of an insulating material including an organic material. For example, the pixel defining layer PDL may include at least one selected from polystyrene, polymethylmethacrylate (PMMA), polyacrylonitrile (PAN), polyimide (PA), polyimide (PI), polyarylether (PAE), heterocyclic polymer, parylene, epoxy, benzocyclobutene (BCB), siloxane based resin, and silane based resin.

A first insulating layer INS1 may be provided on the substrate SUB including the pixel defining layer PDL. The first insulating layer INS1 may cover a portion of an upper surface of each of the bar type LEDs LD provided in each of the first to third sub-pixels SP1, SP2, and SP3. The first end portion EP1 and the second end portion EP2 of each bar type LED LD may be exposed to the outside by the first insulating layer INS1.

The first electrode EL1 may be provided on the protective layer PSV. The first electrode EL1 is disposed adjacent to one of the first and second end portions EP1 and EP2 of a corresponding bar type LED LD, and may be electrically coupled to the corresponding bar type LED LD through the first contact electrode CNE1.

The first electrode EL1 may be electrically coupled to the driving voltage line DVL through a contact hole.

The first electrode EL1 may be provided as a portion of the first connecting line CNL1, or be provided in a shape protruding from the first connecting line CNL1. The first connecting line CNL1 may be a line for applying a voltage to the first electrode EL1 when the corresponding bar type LED LD is aligned.

The second electrode EL2 is disposed adjacent to one of the first and second end portions EP1 and EP2 of the corresponding bar type LED LD, and may be electrically coupled to the corresponding bar type LED LD through the second contact electrode CNE2. The second electrode EL2 included in each of the first to third sub-pixels SP1, SP2, and SP3 may be electrically coupled to the second connecting line CNL2.

The second electrode EL2 is electrically coupled to the drain electrode DE of the transistor T through a contact hole CH penetrating the protective layer PSV, to be supplied with a signal through the transistor T.

The second electrode EL2 may be provided as a portion of the second connecting line CNL2, or be provided in a shape protruding from the second connecting line CNL2. The second connecting line CNL2 may be a line for applying a voltage to the second electrode EL2 when the corresponding bar type LED LD is aligned.

In an embodiment of the present disclosure, the first electrode EL1 and the first connecting line CNL1 may be integrally provided, and the second electrode EL2 and the second connecting line CNL2 may be integrally provided.

The first electrode EL1, the second electrode EL2, the first connecting line CNL1, and the second connecting line CNL2 may include the same (e.g., substantially the same) material. For example, the first electrode EL1, the second electrode EL2, the first connecting line CNL1, and the second connecting line CNL2 may include a conductive material.

The conductive material may include a metal such as Ag, Mg, Al, Pt, Pd, Au, Ni, Nd, Ir, Cr, or any alloy thereof, a conductive oxide such as indium tin oxide (ITO), indium zinc oxide (IZO), zinc oxide (ZnO), or indium tin zinc oxide (ITZO), a conductive polymer such as PEDOT, and the like.

Also, the first electrode EL1, the second electrode EL2, the first connecting line CNL1, and the second connecting line CNL2 may be formed in a single layer. However, the present disclosure is not limited thereto, and the first electrode EL1, the second electrode EL2, the first connecting line CNL1, and the second connecting line CNL2 may be formed in a multi-layer in which two or more materials among metals, alloys, conductive oxides, and conductive polymers are stacked.

In some embodiments, a first partition wall (PW1 of FIG. 4B) may be provided between the protective layer PSV and the first electrode EL1, and a second partition wall (PW2 of FIG. 4B) may be provided between the protective layer PSV and the second electrode EL2.

The first end portion EP1 of each of the first and second bar type LEDs LD1 and LD2 may be disposed adjacent to the first electrode EL1, and the second end portion EP2 of each of the first and second bar type LEDs LD1 and LD2 may be disposed adjacent to one side of the second electrode EL2.

The first contact electrode CNE1 for electrically and/or physically stably coupling the first electrode EL1 and the corresponding bar type LED LD may be provided on the first electrode EL1. When viewed on a plane, the first contact electrode CNE1 may overlap with the first electrode EL1.

The first contact electrode CNE1 may be in ohmic contact with the first electrode EL1.

The first end portion EP1 of each of the first and second bar type LEDs LD1 and LD2 may be electrically coupled to the first electrode EL1 through the first contact electrode CNE1.

Accordingly, a voltage applied to the driving voltage line DVL can be applied to the first end portion EP1 of each of the first and second bar type LEDs LD1 and LD2 through the first electrode EL1 and the first contact electrode CNE1.

A second insulating layer INS2 may be provided on the substrate SUB including the first contact electrode CNE1. The second insulating layer INS2 may be an inorganic insulating layer including an inorganic material or an organic insulating layer including an organic material.

The second contact electrode CNE2 for electrically and/or physically stably coupling the second electrode EL2 and the corresponding bar type LED LD may be provided on the second electrode EL2. When viewed on a plane, the second contact electrode CNE2 may overlap with the second electrode EL2.

The second contact electrode CNE2 may be in ohmic contact with the second electrode EL2.

The second end portion EP2 of each of the first and second bar type LEDs LD1 and LD2 may be electrically coupled to the second electrode EL2 through the second contact electrode CNE2.

Consequently, as a set or predetermined voltage is applied to both the end portions EP1 and EP2 of the first bar type LED LD1 through the first electrode EL1 and the second electrode EL2, the first bar type LED LD1 can be configured to emit the first blue light.

In addition, as a set or predetermined voltage is applied to both the end portions EP1 and EP2 of the second bar type LED LD2 through the first electrode EL1 and the second electrode EL2, the second bar type LED LD2 can be configured to emit the second blue light.

A third insulating layer INS3 may be provided on the substrate SUB on which the second contact electrode CNE2 is provided. The third insulating layer INS3 may cover the second contact electrode CNE2 disposed on the bottom thereof not to be exposed to the outside.

Meanwhile, the display device may further include a color conversion layer CCL.

The color conversion layer CCL may be configured to convert the first and second blue light respectively emitted from the first and second bar type LEDs LD1 and LD2 into light of a set (or specific) color for each sub-pixel.

In an embodiment of the present disclosure, the color conversion layer CCL may include first to third color conversion patterns CCP1, CCP2, and CCP3. The first to third color conversion patterns CCP1, CCP2, and CCP3 may correspond to the sub-pixels, respectively.

For example, the first color conversion pattern CCP1 may correspond to the first sub-pixel SP1, the second color conversion pattern CCP2 may correspond to the second sub-pixel SP2, and the third color conversion pattern CCP3 may correspond to the third sub-pixel SP3.

The first color conversion pattern CCP1 may be configured to convert the first blue light emitted from the first bar type LED LD1 of the first sub-pixel SP1 into red light. The first color conversion pattern CCP1 may be configured to emit red light having a wavelength of about 620 nm to 780 nm by absorbing the first blue light and shifting the wavelength of the first blue light through energy transition.

The first color conversion pattern CCP1 may include a first quantum dot. For example, the first color conversion pattern CCP1 may include the first quantum dot dispersed in transparent resin. The first quantum dot may be a red quantum dot.

In an embodiment of the present disclosure, it is illustrated that the first color conversion pattern CCP1 is provided on the top of the first bar type LED LD1 of the first sub-pixel SP1, but the present disclosure is not limited thereto. For example, the first color conversion pattern CCP1 may be provided on a side surface or the bottom of the first bar type LED LD1 of the first sub-pixel SP1.

The second color conversion pattern CCP2 may be configured to convert the first blue light emitted from the first bar type LED LD1 of the second sub-pixel SP2 into green light. The second color conversion pattern CCP2 may be configured to emit green light having a wavelength of about 500 nm to 570 nm by absorbing the first blue light and shifting the wavelength of the first blue light through energy transition.

The second color conversion pattern CCP2 may include a second quantum dot. For example, the second color conversion pattern CCP2 may include the second quantum dot dispersed in transparent resin. The second quantum dot may be a green quantum dot.

In an embodiment of the present disclosure, it is illustrated that the second color conversion pattern CCP2 is provided on the top of the first bar type LED LD1 of the second sub-pixel SP2, but the present disclosure is not limited thereto. For example, the second color conversion pattern CCP2 may be provided on a side surface or the bottom of the first bar type LED LD1 of the second sub-pixel SP2.

Each of the first and second quantum dots may be selected from a Group II-IV compound, a Group III-V compound, a Group IV-VI compound, a Group IV element, a group IV compound, and a combination thereof.

The Group II-VI compound may be selected from the group consisting of: a binary element compound selected from the group consisting of CdSe, CdTe, ZnS, ZnSe, ZnTe, ZnO, HgS, HgSe, HgTe, MgSe, MgS, and a combination thereof; a ternary element compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and a quaternary element compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The Group III-V compound may be selected from the group consisting of: a binary element compound selected from the group consisting of GaN, GaP, GaAs, GaSb, AlN, AlP, AlAs, AlSb, InN, InP, InAs, InSb, and a combination thereof; a ternary element compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a combination thereof; and a quaternary element compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof.

The Group IV-VI compound may be selected from the group consisting of: a binary element compound selected from the group consisting of SnS, SnSe, SnTe, PbS, PbSe, PbTe, and a combination thereof; a ternary element compound selected from the group consisting of SnSeS, SnSeTe, SnSTe, PbSeS, PbSeTe, PbSTe, SnPbS, SnPbSe, SnPbTe, and a combination thereof; and a quaternary element compound selected from the group consisting of SnPbSSe, SnPbSeTe, SnPbSTe, and a combination thereof.

The Group IV element may be selected from the group consisting of Si, Ge, and a combination thereof. The Group IV compound may be a binary compound selected from the group consisting of SiC, SiGe, and a combination thereof.

The first and second quantum dots may have a full width of half maximum (FWHM) of about 45 nm or less. Light emitted through the first and second quantum dots is emitted in all directions, and hence a wide viewing angle can be achieved.

The shape of the first and second quantum dots may have a generally available shape in the art, and is not particularly limited. For example, the first and second quantum dots may have a shape that is spherical, pyramidal, multi-armed, or cubic nanoparticles, nanotubes, nanowires, nanofibers, nanoplate particles, or the like.

In general, the red and green quantum dots have a characteristic in which their absorption coefficients decrease when the wavelength of incident light increases as shown in FIG. 8A. For example, the absorption coefficients of the red and green quantum dots remarkably decrease when light having a wavelength of 450 nm or more is incident.

Therefore, when the light having a wavelength of 450 nm or more is incident into the red and green quantum dots, the efficiency of light finally emitted from the red and green quantum dots is deteriorated or reduced.

In an embodiment of the present disclosure, the first color conversion pattern CCP1 including the red quantum dot corresponds to the first sub-pixel SP1, and the second color conversion pattern CCP2 including the green quantum dot corresponds to the second sub-pixel SP2.

As described above, the first bar type LED LD1 that is configured to emit the first blue light having a wavelength of about 405 nm may be provided in each of the first and second sub-pixels SP1 and SP2.

Thus, when the first blue light having the wavelength of 405 nm is incident into the red quantum dot, the efficiency of light finally emitted from the first sub-pixel SP1 can increase due to an increase in the absorption coefficient of the red quantum dot.

Similarly, when the first blue light having the wavelength of 405 nm is incident into the green quantum dot, the efficiency of light finally emitted from the second sub-pixel SP2 can increase due to an increase in the absorption coefficient of the green quantum dot.

Hereinafter, changes in light emission efficiency of the red and green quantum dots with respect to changes in wavelength of incident light will be described with reference to FIG. 8B.

In FIG. 8B, a number indicated on the X axis of the graph represents a wavelength (nm) of light incident into the red and green quantum dots, and a number indicated on the Y axis of the graph represents a light emission efficiency (%) in each of the red and green quantum dots.

In FIG. 8B, light emission data of the red and green quantum dots represent values obtained by disposing a plurality of bar type LEDs that are configured to emit light having a wavelength of 405 nm to 455 nm on a substrate, disposing the red and green quantum dots on the top of the plurality of bar type LEDs, and then measuring light emitted from the red and green quantum dots, using a detector. Numerical values obtained by digitizing the data shown in the graph of FIG. 8B are shown in the following Table 1.

TABLE 1

| Wavelength (nm) | Light emission efficiency of green quantum dot | Light emission efficiency of red quantum dot |
| --- | --- | --- |
| 405 | 100% | 100% |
| 415 | 94% | 97% |
| 425 | 80% | 92% |
| 435 | 80% | 88% |
| 445 | 64% | 80% |
| 455 | 53% | 83% |

As can be seen in Table 1 and FIG. 8B, when the wavelength of light incident into the red and green quantum dots is about 405 nm, the efficiency of light emitted from each of the red and green quantum dots was measured as 100%.

When the wavelength of light incident into the red quantum dot is about 455 nm, the efficiency of light emitted from the red quantum dot was measured as 83%. When the wavelength of light incident into the green quantum dot is about 455 nm, the efficiency of light emitted from the green quantum dot was measured as 53%.

From this result, it can be seen that the light emission efficiency (%) increases when the wavelength of light incident into each of the red and green quantum dots decreases. For example, it can be seen that, when the wavelength of light incident into each of the red and green quantum dots is about 405 nm, the efficiency (%) of light emitted from each of the red and green quantum dots is higher than that when the wavelength of light incident into each of the red and green quantum dots is about 450 nm.

Consequently, the first color conversion pattern CCP1 and the first bar type LED LD1 are disposed in the first sub-pixel SP1, and the second color conversion pattern CCP2 and the first bar type LED LD1 are disposed in the second sub-pixel SP2, so that the efficiency of light emitted from each of the first and second pixels SP1 and SP2 can be improved.

Accordingly, the luminance of the display device according to the embodiment of the present disclosure can be increased, and the display quality of an image finally displayed in the display device can be improved.

In addition, the display device according to the embodiment of the present disclosure emits light (e.g., is configured to emit light) having excellent color reproducibility through the color conversion layer CCL including the red and green quantum dots, thereby improving light emission efficiency.

Meanwhile, the third color conversion pattern CCP3 may be configured to allow the second blue light emitted from the second bar type LED LD2 to be transmitted therethrough. To this end, the third color conversion pattern CCP3 may include a transparent layer.

The transparent layer may be made of transparent polymer, and the second blue light emitted from the second bar type LED LD2 is transmitted through the transparent layer, to be emitted as it is.

The third color conversion pattern CCP3 including the transparent layer may be configured to allow the second blue light incident thereinto to be emitted as it is, without any quantum dot. Accordingly, the intensity of light emitted from the third sub-pixel SP3 can be increased.

In some embodiments, the third color conversion pattern CCP3 may include a blue color filter instead of the transparent layer.

The color conversion layer CCL may further include a light blocking layer BLP disposed between the first to third color conversion patterns CCP1, CCP2, and CCP3.

The light blocking pattern BLP is disposed between the first to third color conversion patterns CCP1, CCP2, and CCP3, to prevent (or reduce) mixing of the colors of the first to third color conversion patterns CCP1, CCP2, and CCP3.

Also, the light blocking pattern BLP is disposed in a non-light emitting region except a light emitting region of a corresponding sub-pixel, and prevents the transistor T, the driving voltage line DVL, and the like, which are disposed in the non-light emitting region), from being viewed from the outside (or reduces the visibility of the transistor T, the driving voltage line DVL, and the like from the outside).

The light blocking pattern BLP may include a black matrix. However, the present disclosure is not limited thereto, and the light blocking pattern BLP may be made of materials including a material for blocking light.

An overcoat layer OC may be provided on the color conversion layer CCL. The overcoat layer OC may be a planarization layer for reducing a step difference generated by components disposed on the bottom thereof. Also, the overcoat layer OC may be an encapsulation layer for preventing oxygen and moisture from penetrating into the first and second bar type LEDs LD1 and LD2 (or for reducing a likelihood or amount of oxygen and moisture penetrating into the first and second bar type LEDs LD1 and LD2).

FIGS. 9-15 are cross-sectional views sequentially illustrating a fabricating method of the first to third sub-pixels shown in FIG. 7.

Figure 9:
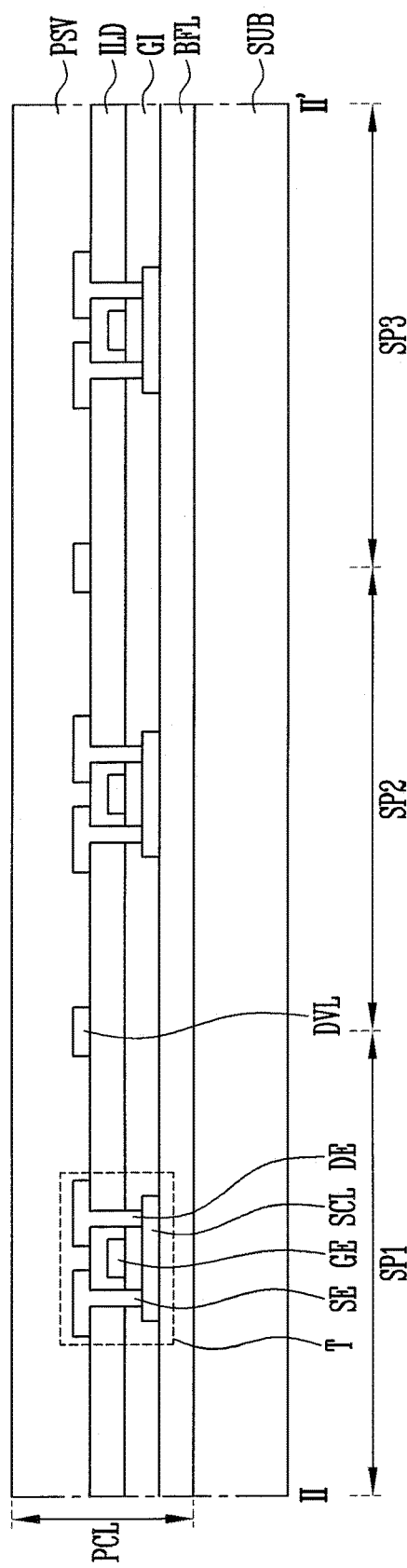
FIGS. 9-15 are cross-sectional views sequentially illustrating a method of fabricating the first to third sub-pixels shown in FIG. 7.

Referring to FIGS. 7 and 9, a transistor T and a protective layer PSV covering the transistor T are formed on a substrate SUB including first to third sub-pixels SP1, SP2, and SP3.

The transistor T may include a semiconductor layer SCL provided on a buffer layer BFL of the substrate SUB, a gate electrode GE provided on the semiconductor layer SCL with a gate insulating layer GI interposed therebetween, and source and drain electrodes SE and DE each coupled to the semiconductor layer SCL.

Figure 10:
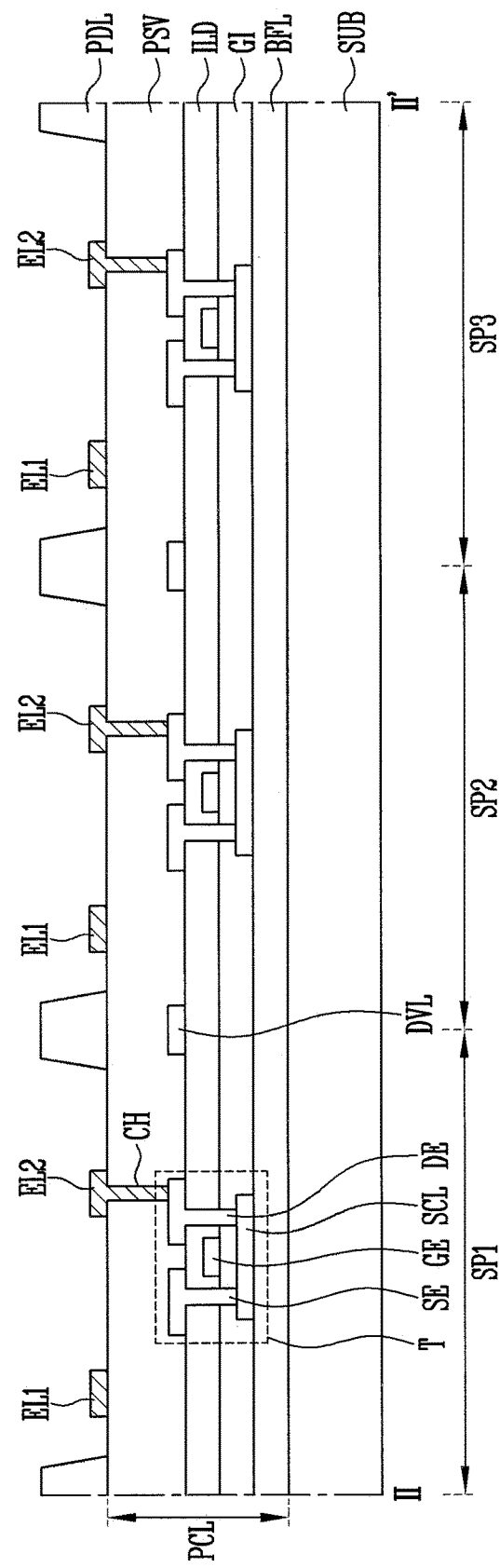

Referring to FIGS. 7 and 10, a pixel defining layer PDL is formed on the protective layer PSV. In addition, a first electrode EL1 and a second electrode EL2 are formed on the protective layer PSV.

The first electrode EL1 and the second electrode EL2 are provided on the same plane, e.g., one surface of the protective layer PSV, and may be spaced apart from each other at a set or certain distance.

The second electrode EL2 may be electrically coupled to the drain electrode DE of the transistor T through a contact hole H penetrating the protective layer PSV.

Figure 11:
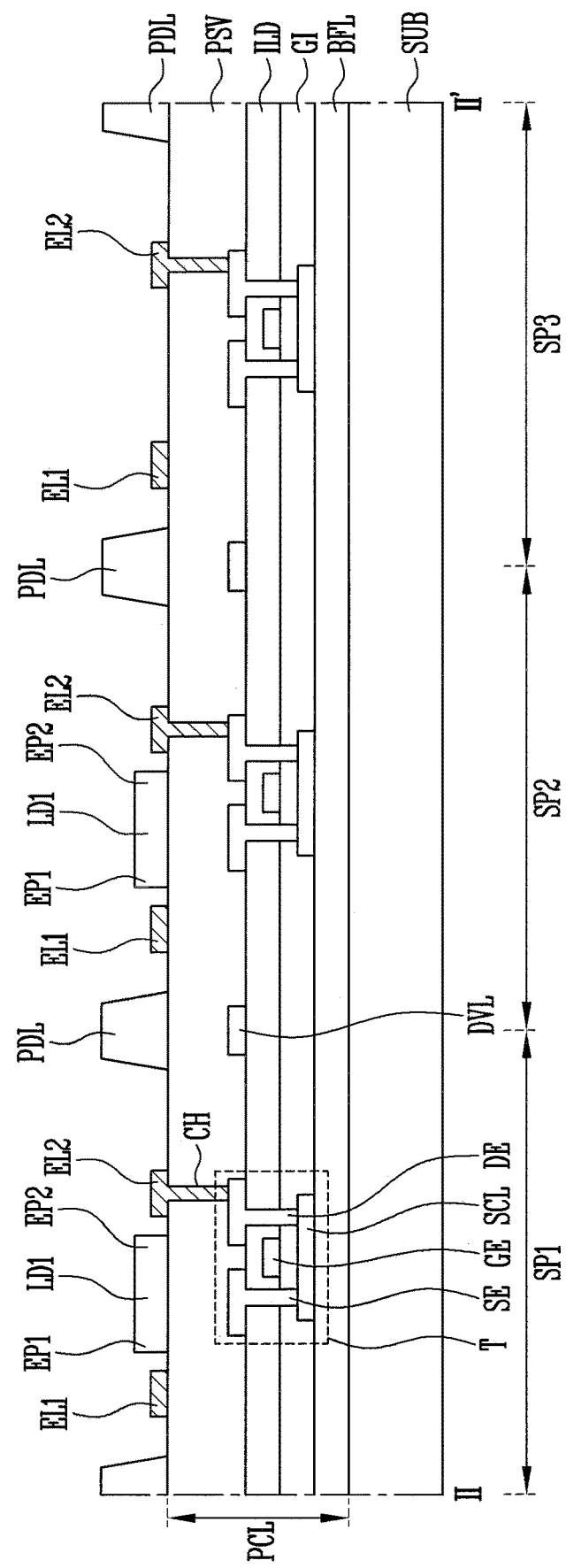

Referring to FIGS. 7 and 11, first bar type LEDs LD1 are scattered on the substrate SUB in a state in which an electric field is applied between the first electrode EL1 and the second electrode EL2, which are provided in each of the first and second sub-pixels SP1 and SP2. In an embodiment of the present disclosure, the first bar type LED LD1 is configured to emit a first blue light having a wavelength of 405 nm.

An inkjet printing technique may be used as a non-restrictive example of a technique of scattering the first bar type LEDs LD1 between the first and second electrodes EL1 and EL2 in each of the first and second sub-pixels SP1 and SP2. However, the present disclosure is not limited thereto.

When the first bar type LEDs LD1 are scattered, the first bar type LEDs LD1 may be self-aligned in the first and second sub-pixels SP1 and SP2 since an electric field is formed between the first and second electrodes EL1 and EL2 provided in the first and second sub-pixels SP1 and SP2.

For example, when power is applied to the first electrode EL1 and the second electrode EL2, which are provided in each of the first and second sub-pixels SP1 and SP2, the bar type LED LD1 may be self-aligned between the first and second electrodes EL1 and EL2 by an electric field formed between the first and second electrodes EL1 and EL2.

Figure 12:
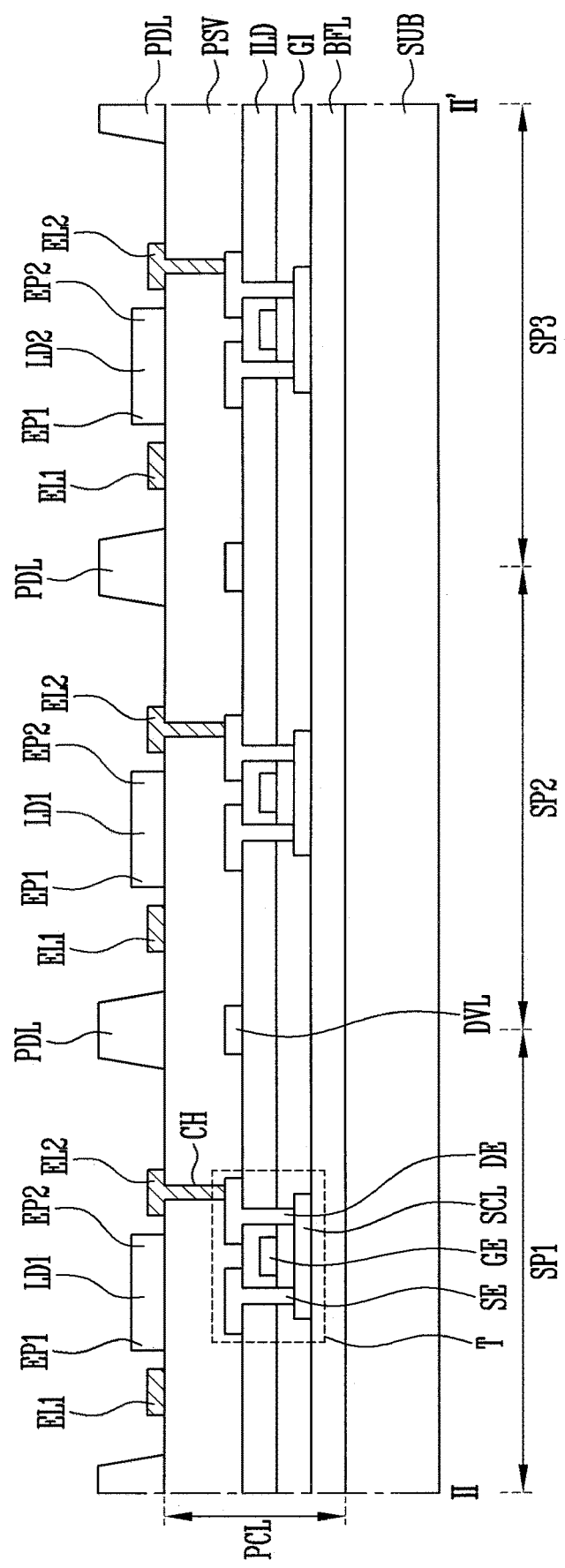

Referring to FIGS. 7 and 12, second bar type LEDs LD2 are scattered on the substrate SUB in a state in which an electric field is applied between the first electrode EL1 and the second electrode EL2, which are provided in the third sub-pixel SP3. In an embodiment of the present disclosure, the second bar type LED LD2 is configured to emit a second blue light having a wavelength of about 450 nm or more.

An inkjet printing technique may be used as a non-restrictive example of a technique of scattering the second bar type LEDs LD2 between the first and second electrodes EL1 and EL2 in the third sub-pixel SP3. However, the present disclosure is not limited thereto.

When the second bar type LEDs LD2 are scattered, the second bar type LEDs LD2 may be self-aligned in the third sub-pixel SP3 since an electric field is formed between the first and second electrodes EL1 and EL2 provided in the third sub-pixel SP3.

Generally, in the existing display device, a bar type LED be configured to emit red light is aligned in the first sub-pixel SP1, a bar type LED emitting green light is aligned in the second sub-pixel SP2, and a bar type LED be configured to emit blue light is then aligned in the third sub-pixel SP3.

As described above, in the embodiment of the present disclosure, the first bar type LED LD1 be configured to emit the first blue light is aligned in the first and second sub-pixels SP1 and SP2, and the second bar type LED LD2 be configured to emit the second blue light is then aligned in the third sub-pixel SP3.

Thus, in the display device according to the embodiment of the present disclosure, the number of processes of aligning the bar type LEDs LD can be decrease, as compare with the existing display device in which bar type LEDs be configured to emit light of different colors are aligned in the first to third sub-pixels SP1 to SP3. Accordingly, in the display device according to the embodiment of the present disclosure, the fabricating process of the display device can be simplified.

Figure 13:
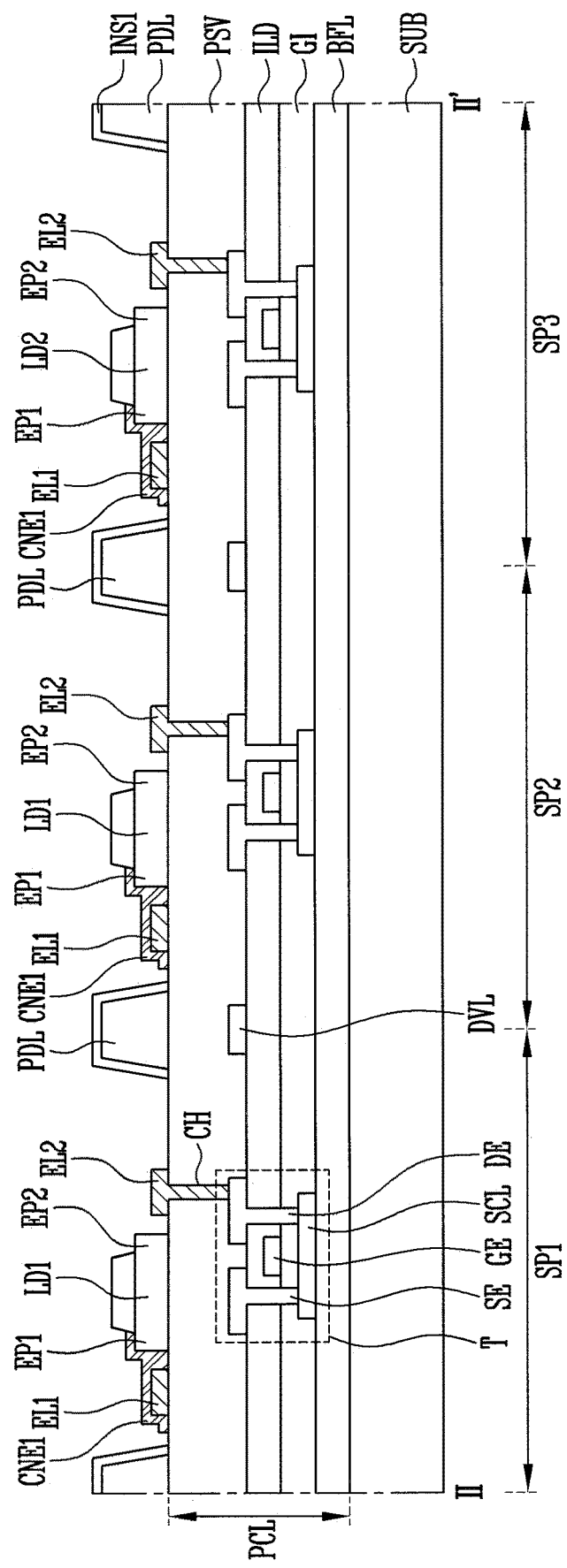

Referring to FIGS. 7 and 13, an insulating material layer is coated onto the entire (e.g., substantially the entire) surface of the substrate SUB on which the first bar type LED LD1 and the second bar type LED LD2 are aligned, and a first insulating layer INS1 that exposes first and second end portions EP1 and EP2 of each of the first and second bar type LEDs LD1 and LD2 is then formed through a mask process.

Subsequently, a first contact electrode CNE1 is formed on the substrate SUB including the first insulating layer INS1.

The first contact electrode CNE1 provided in each of the first and second sub-pixels SP1 and SP2 covers the first end portion EP1 of the first bar type LED LD1 and the first electrode EL1, and electrically couples the first end portion EP1 of the first bar type LED LD1 and the first electrode EL1.

The first contact electrode CNE1 of each of the first and second sub-pixels SP1 and SP2 may electrically and/or physically couple the first electrode EL1 and the first end portion EP1 of the first bar type LED LD1.

An interface between the first end portion EP1 of the first bar type LED LD1 and the first contact electrode CNE1 may be heat-treated. Therefore, the first contact electrode CNE1 and the first end portion EP1 of the first bar type LED LD1 may be in ohmic contact with each other.

The first contact electrode CNE1 provided in the third sub-pixel SP3 covers the first end portion EP1 of the second bar type LED LD2 and the first electrode EL1, and may electrically couple the first end portion EP1 of the second bar type LED LD2 and the first electrode EL1.

The first contact electrode CNE1 of the third sub-pixel SP3 may electrically and/or physically couple the first electrode EL1 and the first end portion EP1 of the second bar type LED LD2.

An interface between the first end portion EP1 of the second bar type LED LD2 and the first contact electrode CNE1 may be heat-treated. Therefore, the first end portion EP1 of the second bar type LED LD2 and the first contact electrode CNE1 may be in ohmic contact with each other.

Figure 14:
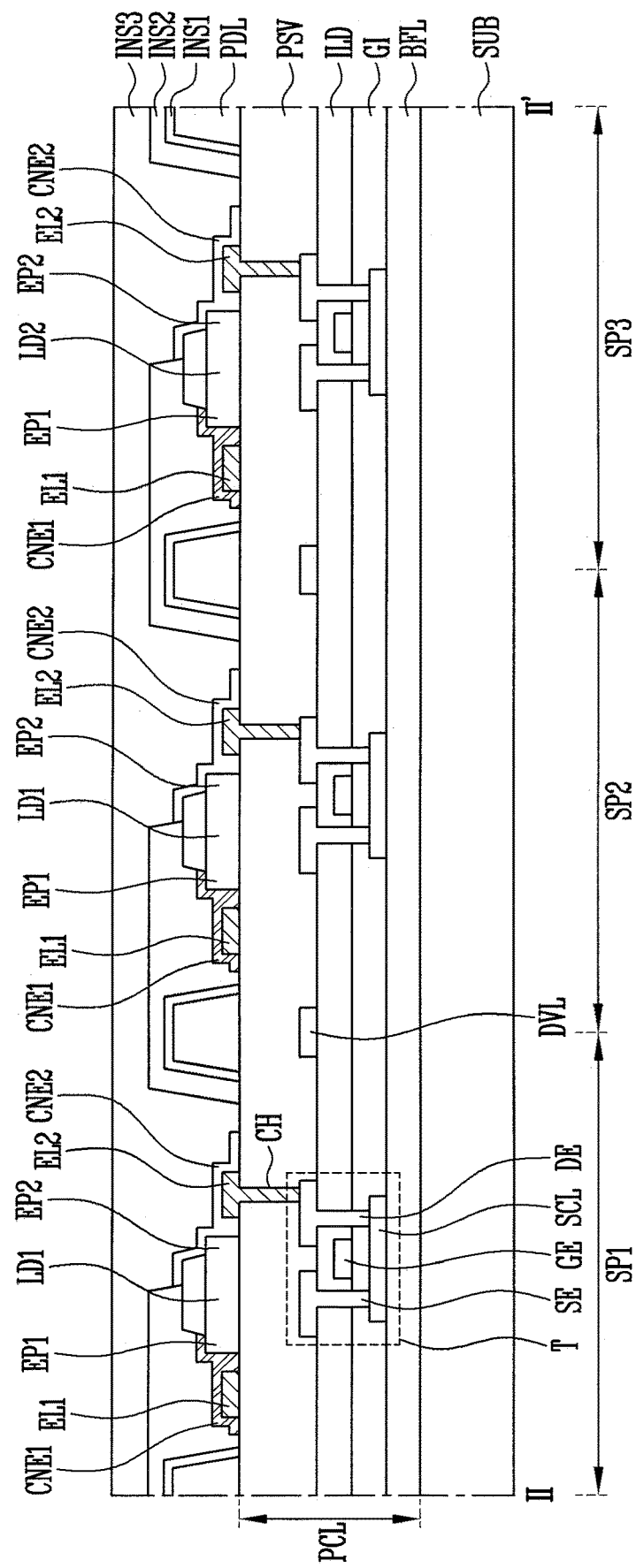

Referring to FIGS. 7 and 14, an insulating material layer is coated onto the entire (e.g., substantially the entire) surface of the substrate SUB including the first contact electrode CNE1, and a second insulating layer INS2 that exposes the second electrode EL2 and the second end portion EP2 of each of the first and second bar type LEDs LD1 and LD2 is then formed through a mask process.

Subsequently, a second contact electrode CNE2 is formed on the substrate SUB including the second insulating layer INS2.

The second contact electrode CNE2 provided in each of the first and second sub-pixels SP1 and SP2 covers the second end portion EP2 of the first bar type LED LD1 and the second electrode EL2, and may electrically couple the first bar type LED LD1 and the second electrode EL2.

The second contact electrode CNE2 provided in each of the first and second sub-pixels SP1 and SP2 may electrically and/or physically couple the second electrode EL2 and the second end portion EP2 of the first bar type LED LD1.

An interface between the second end portion EP2 of the first bar type LED LD1 and the second contact electrode CNE2 may be heat-treated. Therefore, the second contact electrode CNE2 and the second end portion EP2 of the first bar type LED LD1 may be in ohmic contact with each other.

The second contact electrode CNE2 provided in the third sub-pixel SP3 covers the second end portion EP2 of the second bar type LED LD2 and the second electrode EL2, and may electrically couple the second bar type LED LD2 and the second electrode EL2.

The second contact electrode CNE2 provided in the third sub-pixel SP3 may electrically and/or physically couple the second electrode EL2 and the second end portion EP2 of the second bar type LED LD2.

An interface between the second end portion EP2 of the second bar type LED LD2 and the second contact electrode CNE2 may be heat-treated. Therefore, the second contact electrode CNE2 and the second end portion EP2 of the second bar type LED LD2 may be in ohmic contact with each other.

Figure 15:
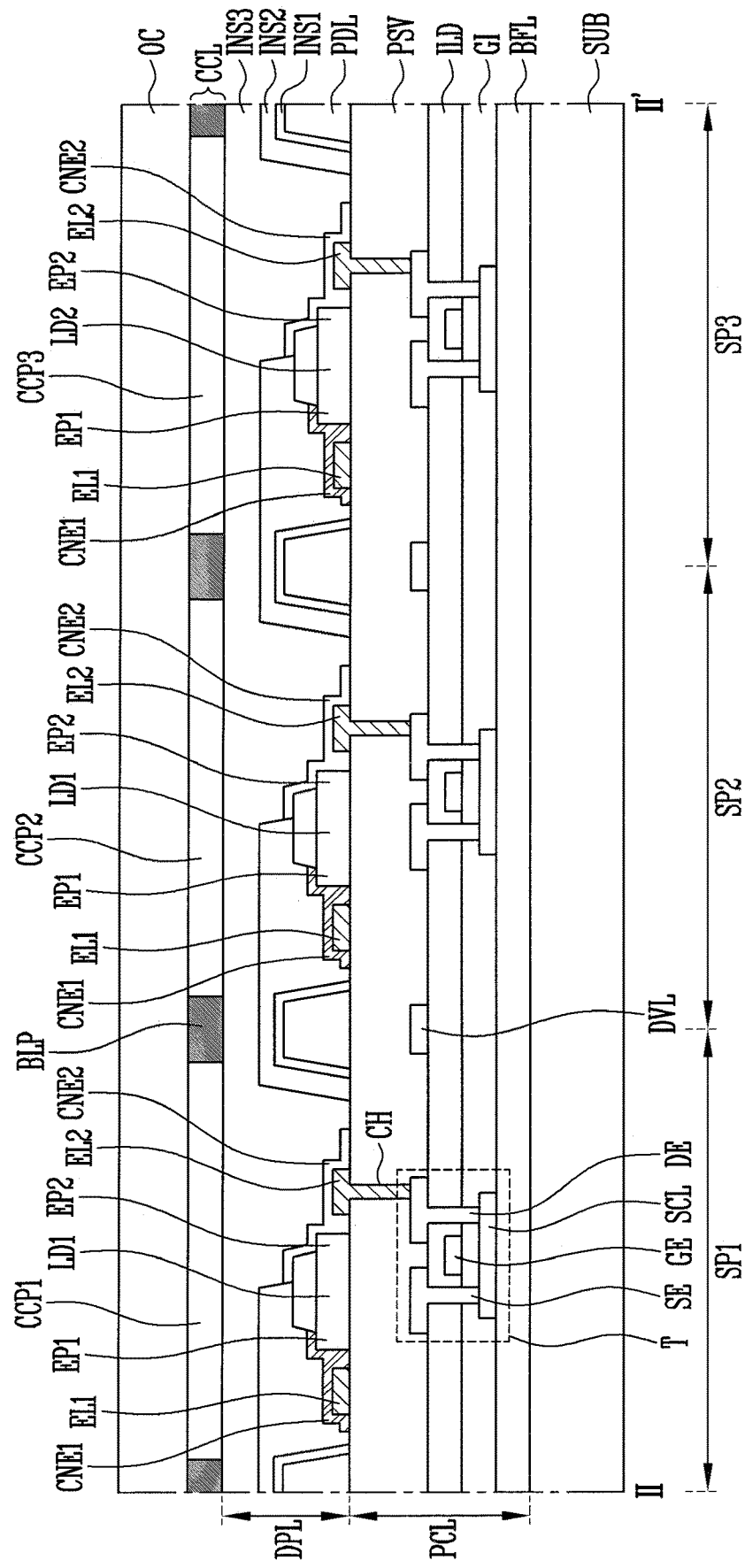

Referring to FIGS. 7 and 15, a third insulating layer INS3 is formed on the substrate SUB including the second contact electrode CNE2. The third insulating layer INS3 covers the second contact electrode CNE2, and prevents (or reduces) corrosion of the second contact electrode CNE2.

Subsequently, a color conversion layer CCL is formed on the third insulating layer INS3.

The color conversion layer CCL may include a first color conversion pattern CCP1 corresponding to the first sub-pixel SP1, a second color conversion pattern CCP2 corresponding to the second sub-pixel SP2, and a third color conversion pattern CCP3 corresponding to the third sub-pixel SP3.

The first color conversion pattern CCP1 may include a red quantum dot that is configured to convert the first blue light emitted from the first bar type LED LD1 of the first sub-pixel SP1 into red light.

The second color conversion pattern CCP2 may include a green quantum dot that is configured to convert the first blue light emitted from the first bar type LED LD1 of the second sub-pixel SP2 into green light.

Subsequently, an overcoat layer OC is formed on the color conversion layer CCL.

The overcoat layer OC covers the color conversion layer CCL, and may planarize a step difference generated by components provided on the bottom thereof. Also, the overcoat layer OC prevents external oxygen and moisture from penetrating into the first and second bar type LEDs LD1 and LD2 (or reduces a likelihood or amount of oxygen and moisture from penetrating into the first and second bar type LEDs LD1 and LD2).

Figure 16:
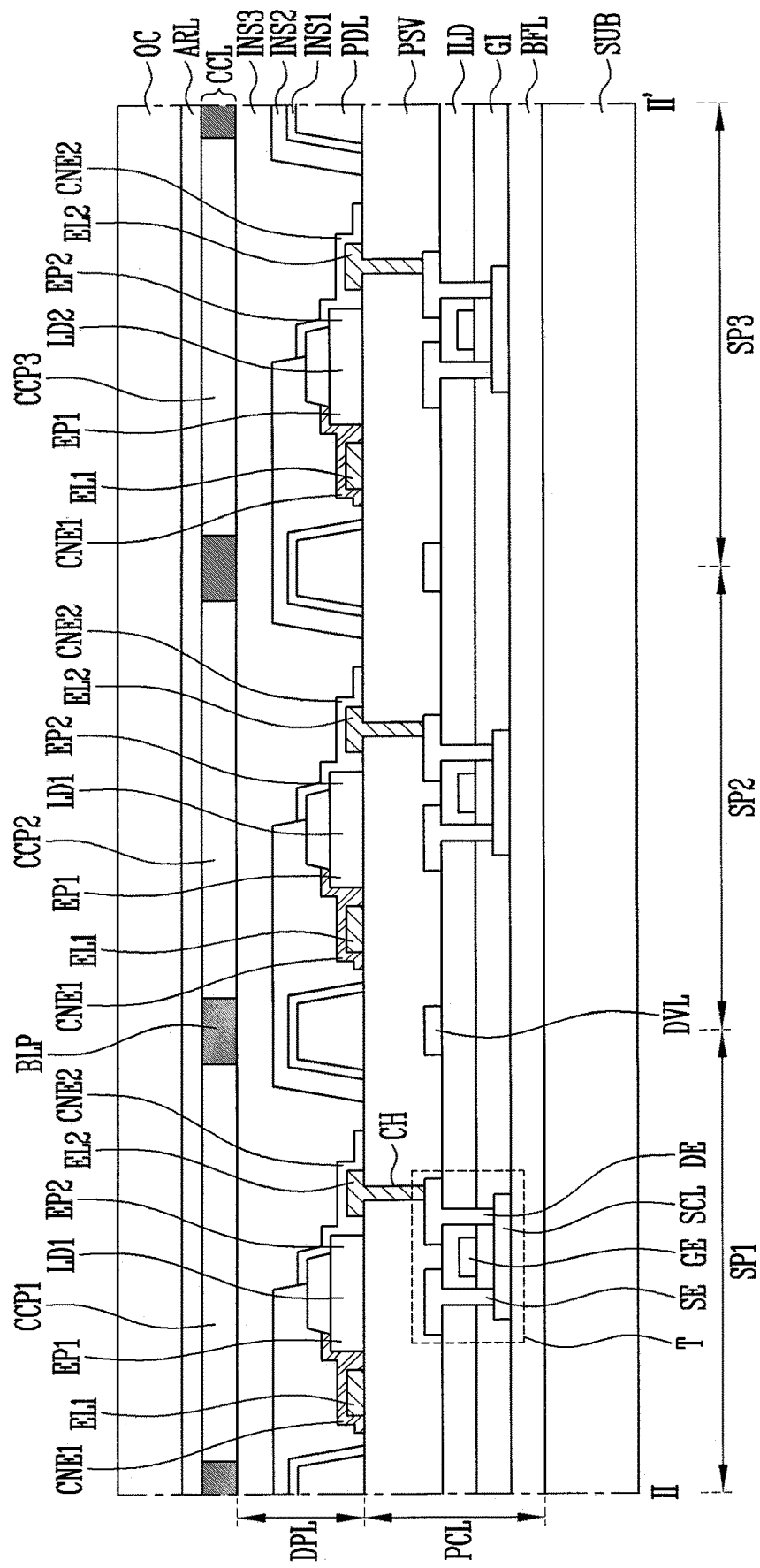
FIG. 16 is a cross-sectional view corresponding to the line II-II' of FIG. 6 and illustrating a display device according to another embodiment of the present disclosure.

FIG. 16 illustrates a display device according to another embodiment of the present disclosure, which is a cross-sectional view corresponding to the line II-II' of FIG. 6. In the another embodiment of the present disclosure, portions different from those of the above-described embodiment will be mainly described to avoid redundancy (e.g., redundant descriptions of features will not be repeated here). Portions of the device not particularly described in this embodiment follow those of the above-described embodiment. In addition, identical reference numerals refer to identical components, and similar reference numerals refer to similar components.

The display device shown in FIG. 16 may have a configuration substantially identical or similar to that of the display device shown in FIGS. 6-7, except an anti-reflection layer is disposed on a color conversion layer.

Referring to FIGS. 6 and 16, the display device according to the another embodiment of the present disclosure may include a substrate SUB on which first to third sub-pixels SP1, SP2, and SP3 are provided.

Each of the first to third sub-pixels SP1, SP2, and SP3 may include the substrate SUB, a pixel circuit unit PCL, a display element layer DPL, and a color conversion layer CCL.

The pixel circuit unit PCL may include a buffer layer BFL disposed on the substrate SUB, a transistor T disposed on the buffer layer BFL, and a driving voltage line DVL.

The display element layer DPL may include a first bar type LED LD1 provided in each of the first and second sub-pixels SP1 and SP2 and a second bar type LED LD2 provided in the third sub-pixel SP3.

In an embodiment of the present disclosure, the first bar type LED LD1 may be configured to emit a first blue light having a wavelength of about 405 nm, and the second bar type LED LD2 may be configured to emit a second blue light having a wavelength of about 450 nm.

The color conversion layer CCL may include a first color conversion pattern CCP1 corresponding to the first sub-pixel SP1, a second color conversion pattern CCP2 corresponding to the second sub-pixel SP2, and a third color conversion pattern CCP3 corresponding to the third sub-pixel SP3.

In an embodiment of the present disclosure, the first color conversion pattern CCP1 may include a red quantum dot that is configured to convert the first blue light emitted from the first bar type LED LD1 of the first sub-pixel SP1 into red light.

The second color conversion pattern CCP2 may include a green quantum dot that is configured to convert the first blue light emitted from the first bar type LED LD1 of the second sub-pixel SP2 into green light.

The third color conversion pattern CCP3 may include a transparent layer or a blue color filter, which is configured to allow the second blue light emitted from the second bar type LED LD2 to be transmitted therethrough.

The color conversion layer CCL may further include a light blocking pattern BLP disposed between the first to third color conversion patterns CCP1, CCP2, and CCP3.

Meanwhile, the display device may further include an anti-reflection layer ARL provided on the color conversion layer CCL.

The anti-reflection layer ARL prevents (or reduces) reflection of light incident into the display device. To this end, the anti-reflection layer ARL may be implemented with at least one of a color filter layer and a polarizing film.

A case where the anti-reflection layer ARL is implemented with the polarizing film will be first described.

The polarizing film has a polarizing axis, and may linearly polarize light in a direction vertical to the polarizing axis. For example, the polarizing film may be configured to allow light parallel to the polarizing axis to be absorbed therein, and be configured to allow light vertical to the polarizing axis to be pass therethrough. Therefore, when the light passes through the polarizing film, the light may be linearly polarized in a direction vertical to the polarizing axis.

The polarizing film absorbs light parallel to the polarizing axis among light that is introduced into the display device and then reflected and emitted from the display device, so that the external light reflexibility of the display device can be reduced.

When the anti-reflection layer ARL is implemented with the color filter layer, the anti-reflection layer ARL may include color filters that are configured to emit light of a set (or specific) color for each of the first to third sub-pixels SP1, SP2, and SP3 and a black matrix provided between the color filters.

The black matrix may prevent (or reduce) mixing of colors of adjacent color filters, and absorb light incident into the display device from the outside to prevent the light from being incident into components disposed on the bottom of the anti-reflection layer ARL (or to reduce an amount of light incident into components disposed on the bottom of the anti-reflection layer ARL). In addition, although light incident from the outside is reflected by the components, a portion of the light may be absorbed by the black matrix.

The color filter may include a red color filter, a green color filter, and a blue color filter. The red color filter may correspond to the first sub-pixel SP1, the green color filter may correspond to the second sub-pixel SP2, and the blue color filter may correspond to the third sub-pixel SP3.

Each of the red, green, and blue color filters serves as a filter that is configured to allow only light having a preset wavelength to pass therethrough. Therefore, although light is incident into the display device from the outside, the light may be blocked by the color filter not to advance downward from the anti-reflection layer ARL.

An overcoat layer OC may be provided on the anti-reflection layer ARL. The overcoat layer OC may be a planarization layer for reducing a step difference generated by components disposed on the bottom thereof. Also, the overcoat layer OC may be an encapsulation layer for preventing oxygen and moisture from penetrating into the first and second bar type LEDs LD1 and LD2 (or for reducing a likelihood or amount of oxygen and moisture penetrating into the first and second bar type LEDs LD1 and LD2).

Figure 17:
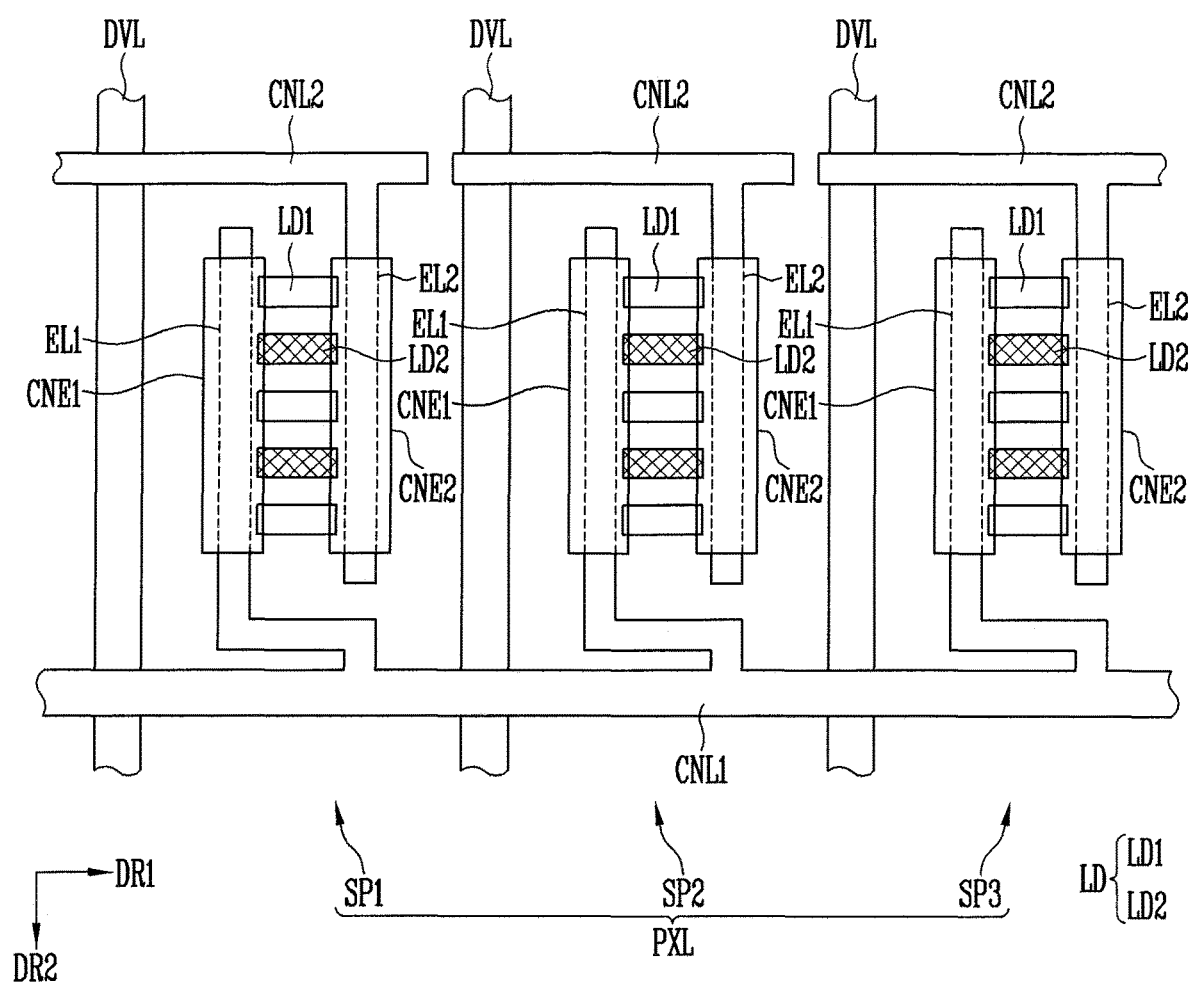
FIG. 17 is a plan view illustrating another embodiment of the first to third sub-pixels included in one pixel among the pixels shown in FIG. 5.

FIG. 17 is a plan view illustrating another embodiment of the first to third sub-pixels included in one pixel among the pixels shown in FIG. 5.

For convenience of description, FIG. 17 illustrates that a plurality of bar type LEDs are arranged in a horizontal direction for convenience of description, but the arrangement of the bar type LEDs is not limited thereto.

Also, in FIG. 17, illustration of a transistor coupled to the bar type LEDs and signal lines coupled to the transistor is omitted for convenience of description.

The display device shown in FIG. 17 may have a configuration substantially identical or similar to that of the display device shown in FIGS. 6-7, except first and second bar type LEDs are mixed and provided in each of the first to third sub-pixels.

Referring to FIGS. 5-7 and 17, the display device according to the embodiment of the present disclosure may include a plurality of pixels PXL provided on a substrate SUB. One pixel PXL may include a first sub-pixel SP1, a second sub-pixel SP2, and a third sub-pixel SP3.

The first to third sub-pixels SP1, SP2, and SP3 may be pixel regions configured to display an image in the one pixel PXL, and be light emitting regions that are configured to emit light.

Each of the first to third sub-pixels SP1, SP2, and SP3 may include a first connecting line CNL1 extending in a first direction DR1, a driving voltage line DVL extending in a second direction DR2 intersecting the first direction DR1, and a second connecting line CNL2 extending in the first direction DR1.

In addition, first and second electrodes EL1 and EL2, first and second contact electrodes CNE1 and CNE2, and first and second bar type LEDs LD1 and LD2 may be provided in each of the first to third sub-pixels SP1, SP2, and SP3.

Each of the first and second bar type LEDs LD1 and LD2 may include a first conductive semiconductor layer (see 11 of FIG. 1), a second conductive semiconductor layer (see 13 of FIG. 1), and an active layer (see 12 of FIG. 1) interposed between the first and second conductive semiconductor layers 11 and 13.

In an embodiment of the present disclosure, the first bar type LED LD1 may be configured to emit a first color light, and the second bar type LED LD2 may configured to emit a second color light. The first color light may be a blue-based light having a wavelength of about 405 nm, and the second color light may be a blue-based light having a wavelength of about 450 nm.

The first and second bar type LEDs LD1 and LD2 may be mixed and provided in each of the first to third sub-pixels SP1, SP2, and SP3. For example, the first and second bar type LEDs LD1 and LD2 may be alternately disposed in a corresponding sub-pixel along the second direction DR2 of the substrate SUB when viewed on a plane, but the present disclosure is not limited thereto.

An inkjet printing technique may be used as a non-restrictive example of a technique of scattering the first and second bar type LEDs LD1 and LD2 into the first to third sub-pixels SP1, SP2, and SP3.

In an example, the first and second bar type LEDs LD1 and LD2 may be scattered into the first to third sub-pixels SP1, SP2, and SP3 by disposing a nozzle on a corresponding substrate SUB and then dropping a solution in which the first and second bar type LEDs LD1 and LD2 are mixed on the substrate SUB. The technique of scattering first and second bar type LEDs LD1 and LD2 on the substrate SUB is not limited thereto.

When the first and second bar type LEDs LD1 and LD2 are scattered, the first and second bar type LEDs LD1 and LD2 may be self-aligned since an electric field is formed between the first and second electrodes EL1 and EL2.

When power is applied to the first electrode EL1 and the second electrode EL2, the dipolarity of the first and second bar type LEDs LD1 and LD2 may be induced by an electric field formed between the first and second electrodes EL1 and EL2 for each sub-pixel.

Accordingly, the first and second bar type LEDs LD1 and LD2 can be self-aligned between the first and second electrodes EL1 and EL2 in the first to third sub-pixels SP1, SP2, and SP3.

As described above, in an embodiment of the present disclosure, the first and second bar type LEDs LD1 and LD2 may be concurrently (e.g., simultaneously) aligned in each of the first to third sub-pixels SP1, SP2, and SP3.

In the display device according to the embodiment of the present disclosure, the fabricating process of the display device can be simplified as compared with an existing display device in which bar type LEDs configured to emit light of different colors are aligned in the first to third sub-pixels SP1 to SP3.

A color conversion layer CCL may be further provided in the first to third sub-pixels SP1, SP2, and SP3.

The color conversion layer CCL may include a first color conversion pattern CCP1 corresponding to the first sub-pixel SP1, a second color conversion pattern CCP2 corresponding to the second sub-pixel SP2, a third color conversion pattern CCP3 corresponding to the third sub-pixel SP3, and a light blocking pattern BLP provided between the first to third color conversion patterns CCP1 to CCP3.

The first color conversion pattern CCP1 may be configured to convert the first and second color light respectively emitted from the first and second bar type LEDs LD1 and LD2 of the first sub-pixel SP1 into red light. To this end, the first color conversion pattern CCP1 may include red quantum dot having a high absorption coefficient when light having a short wavelength is incident thereinto.

The second color conversion pattern CCP2 may be configured to convert the first and second color light respectively emitted from the first and second bar type LEDs LD1 and LD2 of the second sub-pixel SP2 into green light. To this end, the second color conversion pattern CCP2 may include green quantum dot having a high absorption coefficient when light having a short wavelength is incident thereinto.

The third color conversion pattern CCP3 may include a transparent layer that is configured to allow the first and second color light respectively emitted from the first and second bar type LEDs LD1 and LD2 of the third sub-pixel SP3 to be transmitted therethrough.

Meanwhile, a threshold voltage of the first bar type LED LD1 and a threshold voltage of the second bar type LED LD2 may be different from each other. In an embodiment of the present disclosure, the threshold voltage of the first bar type LED LD1 may be set larger than that of the second bar type LED LD2.

Hereinafter, for convenience of description, the threshold voltage of the first bar type LED LD1 is referred to as a "first threshold voltage," and the threshold voltage of the second bar type LED LD2 is referred to as a "second threshold voltage."

When a set or predetermined voltage corresponding to the first threshold voltage or more is applied to both end portions of each of the first and second bar type LEDs LD1 and LD2 through the first and second electrodes EL1 and EL2 disposed in each sub-pixel, both of the first and second bar type LEDs LD1 and LD2 may be driven to emit the first and second blue light.

Also, when a set or predetermined voltage corresponding to the second threshold voltage or more and the first threshold voltage or less is applied to both end portions of each of the first and second bar type LEDs LD1 and LD2 through the first and second electrodes EL1 and EL2 disposed in each sub-pixel, only the second bar type LED LD2 may be driven to emit the second blue light.

In the first sub-pixel SP1, when a set or predetermined voltage corresponding to the first threshold voltage or more is applied to both end portions of each of the first and second bar type LEDs LD1 and LD2, both of the first and second blue light may be emitted.

The first and second blue light emitted from the first sub-pixel SP1 may be converted into red light through the first color conversion pattern CCP1 including the red quantum dot.

In the second sub-pixel SP2, when a set or predetermined voltage corresponding to the first threshold voltage or more is applied to both end portions of each of the first and second bar type LEDs LD1 and LD2, both of the first and second blue light may be emitted.

The first and second blue light emitted from the second sub-pixel SP2 may be converted into green light through the second color conversion pattern CCP2 including the green quantum dot.

In the third sub-pixel SP3, when a set or predetermined voltage corresponding to the second threshold voltage or more and the first threshold voltage or less is applied to both end portions of each of the first and second bar type LEDs LD1 and LD2, only the second blue light may be emitted.

The second blue light emitted from the third sub-pixel SP3 may be transmitted through the transparent layer.

As described above, according to the embodiment of the present disclosure, the first and second bar type LEDs LD1 and LD2 that are be configured to emit blue-based light having a short wavelength respectively correspond to the first and second color conversion patterns CCP1 and CCP2, so that the efficiency of light emitted from each of the first and second sub-pixels SP1 and SP2 can be improved.

Accordingly, the display device according to the embodiment of the present disclosure can display an image having improved display quality.

The display device according to the embodiment of the present disclosure can be employed in various suitable electronic devices. For example, the display device is applicable to televisions, notebook computers, cellular phones, smart phones, smart pads, PMPs, PDAs, navigations, various suitable wearable devices such as smart watches, and the like.

According to embodiments of the present disclosure, there can be provided a display device capable of improving display quality.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Example embodiments have been disclosed herein, and although specific terms are employed, they are used in, and are to be interpreted in, a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments, unless otherwise specifically indicated. Accordingly, it will be understood by those of skill in the art that various changes in form and details may be made without departing from the spirit and scope of the present disclosure as set forth in the following claims, and equivalents thereof.

What is claimed is:

1. A display device comprising:
a substrate comprising a display region and a non-display region;
a first sub-pixel, a second sub-pixel, and a third sub-pixel provided in the display region, the first sub-pixel, the second sub-pixel, and the third sub-pixel each having a light emitting region configured to emit light;
each of the first sub-pixel and the second sub-pixel comprising a first light emitting element configured to emit a first color light, and the third sub-pixel comprising a second light emitting element comprising an active layer comprising indium (In) in an amount such that the second light emitting element emits a second color light having a wavelength longer than a wavelength of the first color light; and
a color conversion layer disposed on the first light emitting elements comprised in each of the first sub-pixel and the second sub-pixel and the second light emitting element comprised in the third sub-pixel, the color conversion layer being configured to convert the first color light into light of a set color for each corresponding one of the first sub-pixel, the second sub-pixel, and the third sub-pixel,
wherein the color conversion layer includes color conversion patterns positioned to correspond to a respective one of the first sub-pixel, the second sub-pixel, and the third sub-pixel,
wherein the first sub-pixel comprising the first light emitting element displays a red light,
wherein the second sub-pixel comprising the first light emitting element displays a green light,
wherein the first color light is a blue-based light having a wavelength only of 405 nm to 445 nm, and
wherein the third sub-pixel comprising the second light emitting element displays the second color light which is a blue-based light having a wavelength only of 450 nm to 455 nm.

2. The display device of claim 1, wherein the color conversion patterns comprise:
a first color conversion pattern corresponding to the first sub-pixel, the first color conversion pattern being configured to convert the first color light into the red light; and
a second color conversion pattern corresponding to the second sub-pixel, the second color conversion pattern being configured to convert the first color light into the green light.

3. The display device of claim 2, wherein the color conversion layer comprises a light blocking pattern respectively provided between the first sub-pixel, the second sub-pixel, and the third sub-pixel.

4. The display device of claim 2, wherein each of the first and second color conversion patterns comprises a quantum dot.

5. The display device of claim 4, wherein the quantum dot of the first color conversion pattern is a red quantum dot, and the quantum dot of the second color conversion pattern is a green quantum dot.

6. The display device of claim 5, wherein the color conversion patterns further comprise a third color conversion pattern that corresponds to the third sub-pixel.

7. The display device of claim 6, wherein the third color conversion pattern includes a transparent layer configured to allow the second color light to be transmitted therethrough.

8. The display device of claim 7, wherein the third color conversion patterns does not include the quantum dot.

9. The display device of claim 7, wherein the third color conversion pattern includes a blue color filter configured to allow the first color light emitted from the second light emitting element to be transmitted therethrough.

10. The display device of claim 2, wherein a quantum dot of the first color conversion pattern and a quantum dot of the second color conversion pattern each have a full width of half maximum of about 45 nm or less.

11. The display device of claim 1, further comprising a planarization layer disposed on the color conversion layer to cover the color conversion layer.

12. The display device of claim 1, wherein each of the first light emitting element and the second light emitting element comprises a light emitting diode having a column shape having a nano scale to a micro scale.

13. The display device of claim 12, wherein each of the first light emitting element and the second light emitting element is disposed on the substrate, and has a first end portion and a second end portion in a length direction.

14. The display device of claim 13, wherein each of the first light emitting element and the second light emitting element comprises:
   a first semiconductor layer corresponding to one of the first end portion and the second end portion and doped with a first conductivity dopant;
   a second semiconductor layer corresponding to a rest of the first end portion and the second end portion and doped with a second conductivity dopant; and
   an active layer provided between the first semiconductor layer and the second semiconductor layer.

15. The display device of claim 14, further comprising:
   a first electrode disposed on the substrate, the first electrode being adjacent to the first end portion of each of the first and second light emitting elements;
   a second electrode disposed on the same plane as the first electrode, the second electrode being adjacent to the second end portion of each of the first and second light emitting elements;
   a first contact electrode electrically connected to the first electrode and the first end portion of each of the first and second light emitting elements; and
   a second contact electrode electrically coupling the second electrode and the second end portion of each of the first and second light emitting elements.

16. The display device of claim 15, wherein:
   each of the first and second electrodes includes a first portion extending along with a first direction and a second portion extending along with a second direction different form the first direction; and
   the second direction is parallel to the length direction of each of the first and second light emitting elements.

17. The display device of claim 1, wherein each of the first sub-pixel, the second sub-pixel, and the third sub-pixel comprises at least one transistor disposed on the substrate to be coupled to a corresponding light emitting element and an insulating layer disposed on the at least one transistor.

18. The display device of claim 17, further comprising:
   a wall disposed between the insulating layer and each of first and second electrodes,
   wherein the wall includes an insulating material and protrudes toward a top of the substrate in a cross-sectional view.

19. The display device of claim 18, wherein:
   each of the first and second electrodes has a shape corresponding to the wall; and
   each of the first electrode, the second electrode, and the wall is a reflecting member that reflects light emitted from the first and second light emitting elements toward a top of the first and second light emitting elements.

20. A display device comprising:
   a substrate comprising a display region and a non-display region;
   a first sub-pixel, a second sub-pixel, and a third sub-pixel third provided in the display region, the first sub-pixel, the second sub-pixel, and the third sub-pixel each having a light emitting region configured to emit light;
   each of the first sub-pixel and the second sub-pixel comprising a first light emitting element configured to emit a first color light, and the third sub-pixel comprising a second light emitting element comprising an active layer comprising indium (In) in an amount such that the second light emitting element emits a second color light having a wavelength longer than a wavelength of the first color light, wherein the first color light is a blue-based light having a wavelength only of 405 nm to 445 nm; and
   a color conversion layer disposed on the first light emitting elements comprised in each of the first sub-pixel and the second sub-pixel and the second light emitting element comprised in the third sub-pixel, the color conversion layer being configured to convert the first color light into light of a set color for each corresponding one of the first sub-pixel, the second sub-pixel, and the third sub-pixel,
   wherein the color conversion layer includes color conversion patterns positioned to correspond to a respective one of the first sub-pixel, the second sub-pixel, and the third sub-pixel, and
   wherein the second color light is a blue-based light having a wavelength only of 450 nm to 455 nm.

* * * * *

UNITED STATES PATENT AND TRADEMARK OFFICE
CERTIFICATE OF CORRECTION

PATENT NO. : 12,362,333 B2  
APPLICATION NO. : 17/077902  
DATED : July 15, 2025  
INVENTOR(S) : Dong Uk Kim Page 1 of 1

It is certified that error appears in the above-identified patent and that said Letters Patent is hereby corrected as shown below:

In the Claims

In Column 32, Line 18, in Claim 20, before "provided" delete "third".

Signed and Sealed this  
Ninth Day of December, 2025

John A. Squires  
*Director of the United States Patent and Trademark Office*